US007529313B2

(12) United States Patent
Naito et al.

(10) Patent No.: US 7,529,313 B2
(45) Date of Patent: May 5, 2009

(54) DISTORTION COMPENSATION QUADRATURE MODULATOR AND RADIO TRANSMITTER

(75) Inventors: Masashi Naito, Tokyo (JP); Yasuhiro Takeuchi, Tokyo (JP); Takashi Okada, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 664 days.

(21) Appl. No.: 11/221,921

(22) Filed: Sep. 9, 2005

(65) Prior Publication Data

US 2006/0062324 A1    Mar. 23, 2006

(30) Foreign Application Priority Data

Sep. 17, 2004  (JP) .............................. 2004-271249
Jul. 7, 2005    (JP) .............................. 2005-198591

(51) Int. Cl.
    *H03K 7/06*    (2006.01)
(52) U.S. Cl. ...................................... 375/271
(58) Field of Classification Search ................. 375/296, 375/295, 298; 455/126
    See application file for complete search history.

(56) References Cited

U.S. PATENT DOCUMENTS 5,293,406 A * 3/1994 Suzuki ......................... 375/295
5,732,333 A * 3/1998 Cox et al. .................... 455/126
2006/0062324 A1* 3/2006 Naito et al. .................. 375/296

* cited by examiner

*Primary Examiner*—Chieh M Fan
*Assistant Examiner*—Jaison Joseph
(74) *Attorney, Agent, or Firm*—Wenderoth, Lind & Ponack, L.L.P.

(57) ABSTRACT

An apparatus includes: an affine transformer that subjects input complex IF signals I(t) and Q(t) to affine transformation according to affine transformation coefficients, and outputs compensated signals a(t) and b(t); a quadrature modulator that applies quadrature modulation on a local oscillation signal according to the compensated signals, and outputs a modulated signal (RF transmission signal); a quadrature wave detector that removes a carrier component from the modulated signal and outputs complex feedback signals I'(t) and Q'(t); and a control portion that extracts linear distortions remaining in the complex feedback signals I'(t) and Q'(t) as plural distortion coefficients (DC offsets of the I-phase and the Q-phase, an IQ gain ratio, and a deviation in orthogonality), and updates the current affine transformation coefficients in accordance with updating equations including the distortion coefficients to set updated affine transformation coefficients again in the affine transformation portion.

9 Claims, 14 Drawing Sheets

Before distortion compensation

After distortion compensation

DISTORTION COMPENSATION QUADRATURE MODULATOR AND RADIO TRANSMITTER

BACKGROUND OF THE INVENTION

1. Field of the Invention

The present invention relates to a distortion compensation quadrature modulator and a radio transmitter, and more particularly, to a distortion compensation quadrature modulator and a radio transmitter that output a highly accurate quadrature modulated wave by means of an analog quadrature modulator.

2. Description of Related Art

For a digital modulation scheme used in a mobile communication system, such as W-CDMA and PDC, for which the usable band of radio frequencies is limited, it is necessary to use a modulator with a higher degree of accuracy than in an analog modulation scheme, such as AM and FM. Although it is negligible for a quadrature modulator comprising a digital circuit, it is crucial to compensate for three kinds of linear distortions as specified below for a quadrature modulator comprising an analog element.

Firstly, for output signals I(t) and Q(t) from a digital-to-analog converter used as inputs to a quadrature modulator, it is difficult to completely adjust an offset of a DC component generated with respect to an original null-balance modulating signal. In addition, the DC offset shifts due to a change in temperature and a change with time, and the shift of the DC offset allows a carrier leak component to be superimposed on the modulated wave.

Secondly, an average amplitude ratio of the analog modulating signals I(t) and Q(t) shifts from the original ratio of "1", which allows a distortion component to be superimposed on an image frequency region.

Thirdly, although a quadrature modulator needs a $\pi/2$ phase shifter, it is difficult to manufacture the $\pi/2$ phase shifter with precision, and a deviation in orthogonality causes a distortion component to be superimposed on an image frequency region.

In particular, it has been becoming increasingly important to solve problems resulting from the analog element in a direct conversion method that is expected to achieve a reduction of a circuit size by converting a baseband signal directly to an RF frequency.

These problems are solved by the technique disclosed in Hiroshi SUZUKI et al, "AFFINE-henkan senkeihizumi hoshou—idou-musen tsuusin niokeru touka o fukumu senkeisingoudensou heno tekiyou", *IEICE Transactions B*-II, January 1992, Vol. J75-B-II, No. 1, pp. 1-9. FIG. 15 shows a schematic configuration according to this technique.

Referring to FIG. 15, numeral 120 denotes a distortion compensation circuit, numeral 3 denotes a quadrature modulator, numeral 150 denotes a wave detector that detects an RF transmission signal, numeral 160 denotes an LPF that equalizes detection outputs, and numeral 170 denotes a control circuit that generates distortion compensation coefficients and a test pattern. An affine transformer 121 has a configuration as shown in FIG. 2, and functions to correct a DC offset, an IQ gain difference, and a deviation in orthogonality present in the quadrature modulator by providing a0, b0, $\alpha$, and $\theta$. A concrete control method is as follows. That is, a test pattern signal is outputted by switching an SW2 and an SW3 to the control circuit 170, and DC offsets a' and b' are first found and set by observing an output from the LPF 160. Then, a test pattern signal is transmitted by switching an SW0 and an SW1 to the control circuit 170 while switching the SW2 and SW3 to the affine transformer 121, and $\alpha$ and $\theta$ are found by observing an output level of the LPF 160.

According to the technique in the related art as described above, however, respective distortion compensation coefficients are derived by transmitting a test pattern signal on the assumption that the coefficients are set at the shipment from the factory or set again by suspending the operation. Hence, respective distortion compensation coefficients cannot bederivedwhile the modulating signals I(t) and Q(t) essential for enabling communications are transmitted. The technique in the related art, therefore, is not applicable to a case where transmission cannot be suspended in a reliable manner to derive distortion compensation coefficients under operating conditions, for example, a base station that transmits signals at random timing. This technique therefore has a problem that it fails to address a change in temperature and a change with time.

The technique in the related art may be improved in such a manner that modulating signals are switched to a quadrature modulator in another system to secure a modulation output while a test pattern signal is transmitted. However, it is difficult to switch systems in complete absence of interruption with waves, and this alternative is not practical in terms of the cost and due to the incapability of addressing changes.

SUMMARY OF THE INVENTION

The invention was devised in view of the foregoing, and therefore has an object to provide a distortion compensation quadrature modulator always capable of updating distortion compensation coefficients most appropriately under operating conditions.

The invention has another object to provide a compensator capable of efficiently compensating for a DC offset generated on a complex amplitude signal to be processed.

The invention provides a distortion compensation quadrature modulator, including:

an affine transformation portion that subjects input complex amplitude signals (modulating signals) I(t) and Q(t) to affine transformation according to affine transformation coefficients, and outputs compensated signals a(t) and b(t);

a quadrature modulator that applies quadrature modulation on a local oscillation signal on the basis of the input compensation signals, and outputs a modulated signal as a real signal;

a quadrature detection portion that removes a carrier component from one of the input modulated signal and a signal that is the modulated signal having undergone at least one of frequency conversion and amplification, and outputs complex feedback signals I' (t) and Q' (t); and a control portion that extracts linear distortions remaining in the complex feedback signals I' (t) and Q' (t) as distortion coefficients, and updates the current affine transformation coefficients to new affine transformation coefficients in accordance with updating equations including the distortion coefficients, so that updated affine transformation coefficients are set again in the affine transformation portion.

The invention provides another distortion compensation quadrature modulator, including:

a test signal generation portion that generates complex test signals each having plural points on an IQ plane as signal points;

an affine transformation portion that subjects input complex test signals to affine transformation according to given affine transformation coefficients, and outputs compensated signals a(t) and b(t);

a quadrature modulator that applies quadrature modulation on a local oscillation signal according to the input compensated signals, and outputs a modulated signal as a real signal;

a quadrature detection portion that removes a carrier component from one of the input modulated signal and the real signal based on the modulated signal, and outputs complex feedback signals; and a linear distortion detection portion that extracts linear distortions remaining in the complex feedback signals as four distortion coefficients corresponding, respectively, to an I-phase component of a DC offset, a Q-phase component of the DC offset, an IQ gain ratio, and a deviation in orthogonality.

The linear distortion detection portion performs processing as follows:

processing by which, for two points of each test signal that are symmetric with respect to an original point on the IQ plane, a distance from a mid point between two points of a corresponding complex feedback signal to the original point on the IQ plane is found, and the I-phase component and the Q-phase component of the DC offset are determined at least on the basis of the distance from the mid point to the original point;

processing by which, for four points of the test signals forming sets of two points placed to be symmetric with respect to the original point at a 90° interval on the IQ plane, a distance between two points of a corresponding complex feedback signal in each set on the IQ plane is found, and the IQ gain ratio is determined on the basis of distances between the two points in respective sets; and processing by which, for four points of the test signals forming sets of two points placed to be symmetric with respect to the original point at a 90° interval on the IQ plane, a value corresponding to a shift of an angle, at which lines linking two points of the corresponding complex feedback signals in respective sets on the IQ plane cross each other, from a right angle is found to determine the deviation in the orthogonality.

The invention also provides a radio transmitter that performs transmission of plural communication channels. The radio transmitter includes:

a digital modulation circuit that synthesizes signals by applying digital modulation at frequencies corresponding to respective carriers according to complex baseband signals of input N carriers (N is an integer equal to or greater than 1), and outputs complex IF signals I(t) and Q(t);

an affine transformation circuit that subjects the input complex amplitude signals I(t) and Q(t) to affine transformation expressed by:

$a(t)=I(t)+Q(t)\cdot\tan\theta+a$ $b(t)=Q(t)/(\alpha\cos\theta)+b$ where a, b, $\tan\theta$, and $1/(\alpha\cos\theta)$ are affine transformation coefficients, and outputs compensated signals a(t) and b(t) in which a DC offset, an IQ gain ratio, and a deviation in orthogonality are compensated for;

a digital-to-analog converter that converts the input compensated signals a(t) and b(t) in digital forms to analog forms and outputs resulting signals;

a quadrature modulator that applies quadrature modulation on a carrier signal according to outputs inputted from the digital-to-analog converter, and outputs an RF signal;

a power amplifier that amplifies power of the input RF signal, and outputs a resulting signal;

a quadrature detection circuit that subjects a signal based on an output inputted from the power amplifier to digital quadrature detection, and outputs complex feedback signals I' (t) and Q' (t) at an IF frequency substantially equal to a frequency in the digital modulation circuit;

a phase rotation removing circuit that performs complex conjugate multiplication of each input complex IF signal and each complex feedback signal, detects an argument as a phase difference $\phi$ between the complex IF signal and the complex feedback signal, and outputs rotation removed signals $I_r(t)$ and $Q_r(t)$ by removing the phase rotation $\phi$ from each complex feedback signal;

a linear distortion detection portion that extracts linear distortions remaining in the complex feedback signals I' (t) and Q' (t) as four distortion coefficients a', b', $\alpha$, and $\sin\theta$ corresponding, respectively, to an I-phase component and a Q-phase component of a DC offset, an IQ gain ratio, and a deviation in orthogonality; and a coefficient updating portion that updates the current affine transformation coefficients to new affine transformation coefficients in accordance with updating equations including the distortion coefficients, so that updated affine transformation coefficients are set again in the affine transformation portion.

In a case where the linear distortions are detected while the radio transmitter is under non-operating conditions, the linear distortion detection portion performs processing as follows:

processing by which, for two signal points of a test signal made of a rectangular wave on one of an I-phase and a Q-phase that are symmetric with respect to an original point, a mid point of a corresponding complex feedback signal on an IQ plane is found, the mid point is detected by setting a DC offset whose phase is varied in the affine transformation portion on the assumption that a distance between the mid point and the original point represents magnitude of the DC offset, and the I-phase component and the Q-phase component of the DC offset are determined from the magnitude and the phase of the DC offset at which the distance between the mid point and the original point is minimum;

processing by which, for sets of two signal points of test signals each being made of a time-divided rectangular wave on the I-phase and a time-divided rectangular wave on the Q-phase that are symmetric with respect to the original point, a distance between two points of a corresponding complex feedback signal on the IQ plane in each set is found, and the IQ gain ratio is determined on the basis of distances between the two points in respective sets; and processing by which, for sets of two signal points of test signals each being made of a rectangular wave on the I-phase and a rectangular wave on the Q-phase, each wave being time-divided at one cycle interval and having different amplitude, that are symmetric with respect to the original point, a value corresponding to a shift of an angle, at which lines linking two points of corresponding complex feedback signals in respective sets on the IQ plane cross each other, from a right angle is found to determine the deviation in orthogonality.

In a case where the linear distortions are detected while the radio transmitter is under operating conditions, the linear distortion detection portion calculates the four distortion coefficients in accordance with equations as follows:

$a'=<I_r(t)>$ $b'=<Q_r(t)>$ $\alpha=(<I_r(t)^2>/<Q_r(t)^2>)^{1/2}$ $\sin\theta'=-<I_r(t)\,Q_r(t)>/\{<I_r(t)^2><Q_r(t)^2>\}^{1/2}$ where < > means a long-term average value, and the coefficient updating portion uses equations as follows as the updating equations:

$$a_n = a_{n-1} - \mu a'$$

$$b_n = b_{n-1} - \mu b'$$

$$\alpha_n = \alpha_{n-1} \times (\alpha')^{1/m}$$

$$\sin \theta_n = \sin \theta_{n-1} + \mu \sin \theta'$$

$$\cos \theta_n = (1 - \sin^2 \theta_n)^{1/2}$$

$$\tan \theta_n = \sin \theta_n / \cos \theta_n$$

The long-term average is a time average corresponding to a length of 4096 chips or more.

The radio transmitter includes a delay lock loop that controls a delay between the complex IF signal and the complex feedback signal so that the complex IF signal and the complex feedback signal are brought into coincidence at time accuracy less than a reciprocal number of a sample rate of the complex IF signal, and the delay lock loop provides, as a delay time difference to be provided to a late path and an early path, a time equal to or less than twice a bandwidth of the complex IF signal and equal to or more than twice a variable step unit of the delay time in the FDF.

The invention further provides a compensator that compensates for a DC offset on input complex amplitude signals, including:

a DC offset correction portion that provides an I-phase correction value and a Q-phase correction value of the DC offset, respectively, to an I-phase component and a Q-phase component of each input complex amplitude signal;

a level detection portion that feeds back each complex amplitude signal to which the correction values are provided from the DC offset correction portion, and detects a level of a feedback signal; and a correction value control portion that controls the I-phase correction value and the Q-phase correction value provided from the DC offset correction portion according to the level detected by the level detection portion.

The correction value control portion searches through plural points provided initially on an IQ plane at regular intervals for a point at which the level detected by the level detection portion is minimum when a level of the input complex amplitude signal is 0 in a case where the I-phase component value and the Q-phase component value of each point are set in the DC offset correction portion as the I-phase correction value and the Q-phase correction value, and thereafter, conducts the search once or more using the point searched in a last time as a central point while making the regular intervals smaller than in the last time, so that the I-phase component value and the Q-phase component value of a point searched finally are adopted as the I-phase correction value and the Q-phase correction value and set in the DC offset correction portion.

The distortion compensation quadrature modulator and the radio transmitter of the invention are able to address a change in temperature and a change with time by constantly updating the distortion compensation coefficients (affine transformation coefficients) under operating conditions (while I(t) and Q(t) are transmitted) in the most appropriate manner.

Also, the compensator of the invention is able to efficiently compensate for a DC offset generated on the complex amplitude signals.

DETAILED DESCRIPTION OF THE INVENTION

Figure 1:
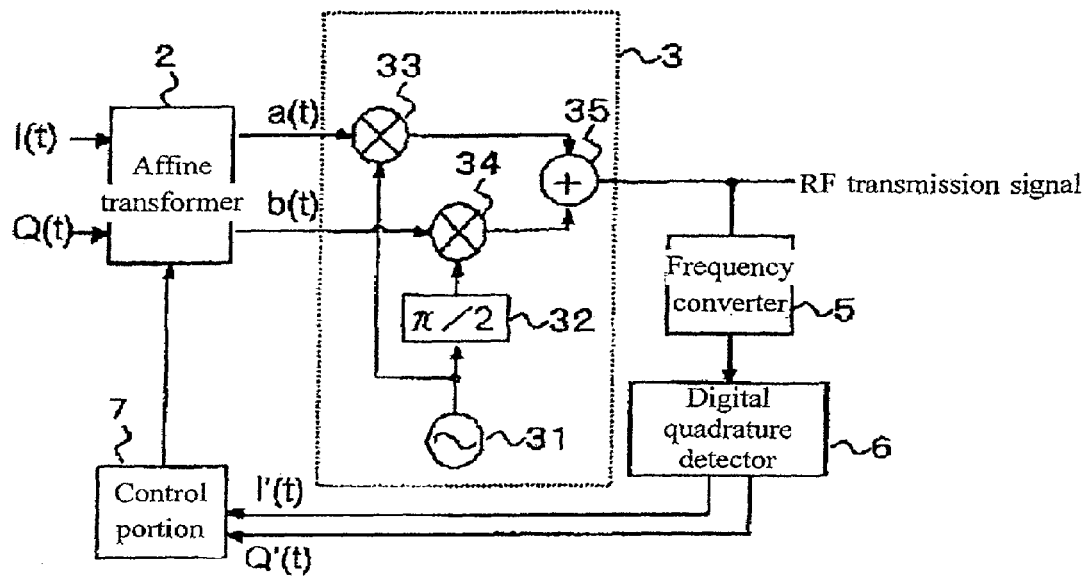
FIG. 1 is a view showing the configuration of a constantly-updated distortion compensation quadrature modulator in a best mode of the invention.

FIG. 1 is a view showing the configuration of a constantly-updated distortion compensation quadrature modulator according to one embodiment of the invention.

Numeral 2 denotes an affine transformer, numeral 3 denotes a quadrature modulator, numeral 5 denotes a frequency converter that converts an RF frequency to an intermediate frequency band, and numeral 6 denotes a digital quadrature detector that converts an intermediate frequency signal to quadrature detection signals I' (t) and Q' (t) through analog-to-digital conversion. The affine transformer 2 is of the same configuration as the counterpart in the related art shown in FIG. 2. The digital quadrature detector 6 is used on the premise that, in principle, a DC offset, an IQ gain ratio, and a distortion in the IQ orthogonality in a quadrature detector will not occur in a digital quadrature detector. Numeral 7 denotes a control portion that updates distortion compensation coefficients used in the affine transformer 2.

An algorithm for updating respective distortion compensation coefficients in the control portion 7 will now be described.

According to the underlying principle, a correction error is extracted from digital quadrature detection outputs, namely, signals I' (t) and Q' (t), which are the outputs using affine transformation coefficients set in the affine transformer 2 at a given time, and the respective affine transformation coefficients are refined to optimum values in accordance with updating equations.

Let $a_n$ be a DC offset on the I(t) side, $b_n$ be a DC offset on the Q(t) side, $\alpha_n$ be an IQ gain ratio, and $\sin\theta_n$ be a sine of the shift angle of the IQ orthogonality after initial coefficients are updated n times. Also, regarding those remaining in the current digital quadrature detection outputs, let a' be a DC offset on the I(t) side, b' be a DC offset on the Q(t) side, α' be an IQ gain ratio, and sin θ' be a sine of the shift angle of the IQ orthogonality. Then, calculations as follows are performed using the digital quadrature detection outputs I' (t) and Q' (t).

Initially, a phase difference φ between the modulating signals (I(t) and Q(t)) and corresponding outputs, that is, digital quadrature detection signals (I' (t) and Q' (t)), is found to compensate for a phase rotation.

$$\phi = \text{Arg}[(I(t)+jQ(t))(I'(t)-jQ'(t))] \qquad (1)$$

$$I_r(t) = I'(t)\cos\phi - Q'(t)\sin\phi \qquad (2)$$

$$Q_r(t) = Q'(t)\cos\phi + I'(t)\sin\phi \qquad (3)$$

where Arg[ ] represents an argument of a complex number. It should be noted that delays in the affine transformer 2, the quadrature modulator 3, and the frequency converter 5 are not particularly considered in Equations (1) through (3).

Subsequently, distortion coefficients representing respective residual distortions are found in accordance with the following equations:

$$a' = <Ir(t)> \qquad (4)$$

$$b' = <Qr(t)> \qquad (5)$$

$$\alpha = (<Ir(t)2>/<Qr(t)2>)1/2 \qquad (6)$$

$$\sin\theta' = -<Ir(t)Qr(t)>/\{<Ir(t)2><Qr(t)2>\}1/2 \qquad (7)$$

where < > represents a long-term average value.

Subsequently, affine transformation coefficients are updated using the distortion coefficients found in accordance with Equations (4) through (7) above.

$$an = an-1-\mu a' \qquad (8)$$

$$bn = bn-1-\mu b' \qquad (9)$$

$$\alpha n = \alpha n-1 \times (\alpha')1/m \qquad (10)$$

$$\sin\theta n = \sin\theta n-1 + \mu\sin\theta' \qquad (11)$$

($\sin\theta \cong \theta$ when $\theta \cong 0$, and we can therefore use approximation)

$$\cos\theta n = (1-\sin 2\theta n)1/2 \qquad (12)$$

$$\tan\theta n = \sin\theta n/\cos\theta n \qquad (13)$$

where μ and m are step parameters, and in general, μ is of the order of ¼ to ⅟512 and m is an integer equal to or greater than 1.

First Embodiment

A first embodiment will describe a case where the invention is applied to a radio transmitter (radio base station) that transmits a 4-carrier W-CDMA (Wide-Code Division Multiple Access) signal. The radio transmitter in this embodiment is further provided with an algorithm for updating distortion compensation coefficients with the use of a special test signal to accelerate an adjusting step under non-operating conditions, such as at the shipment from the factory. It should be appreciated that this embodiment will be described by way of example. Hence, numerical values, a processing procedure, devices for implementation (hardware) of the invention are not limited to those specified concretely in this embodiment, and can be therefore modified.

Figure 3:
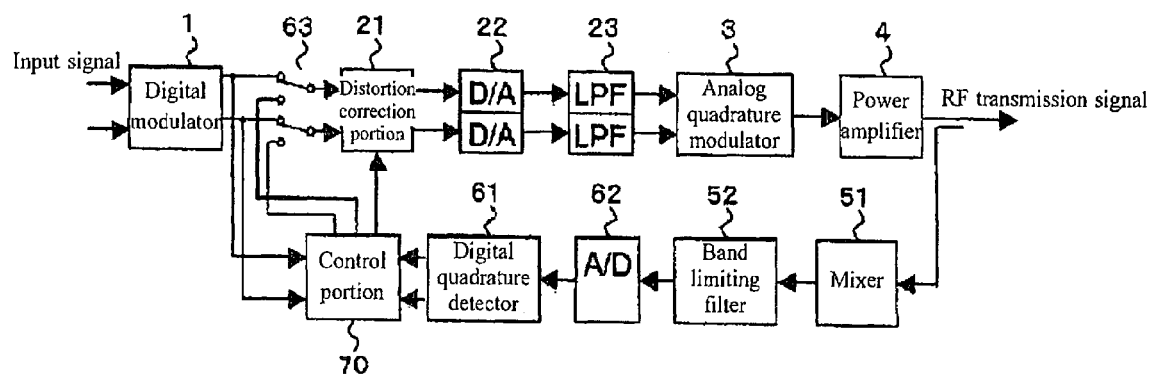
FIG. 3 is a view showing the configuration of a radio transmitter of a first embodiment.

FIG. 3 is a view showing the configuration of the radio transmitter of this embodiment, and shows only a transmission system after baseband processing and an accompanying return system.

A digital modulation portion 1 applies band limiting, digital quadrature modulation and the like to an input baseband signal (IQ signal) for each carrier, synthesizes these signals, and outputs the result. An output from the digital modulation portion 1 is an IQ signal in the IF (Intermediate Frequency) band.

A distortion correction portion 21 corrects a DC offset, an IQ gain ratio, and a deviation in orthogonality in an output from the digital modulation portion 1 through affine transformation, and also performs DPD (Digital PreDistortion) processing.

A digital-to-analog converter 22 converts an I-phase and a Q-phase of a digital signal inputted from the distortion correction portion 21 to analog signals.

An LPF 23 removes frequency components other than those in the target IF frequency band from an output from the digital-to-analog converter 22.

An analog quadrature modulator 3 applies analog quadrature modulation using outputs from the LPF 23, and outputs a modulated signal (real signal) in the target RF (Radio Frequency) band.

A power amplifier 4 amplifies an output from the analog quadrature modulator 3 until it achieves power needed for radio transmission.

Upon input of part of an output from the power amplifier 4, a mixer 51 down-coverts the input to an IF frequency.

A band limiting filter 52 applies band limiting to an output from the mixer 51 to remove frequency components other than those in the target IF frequency band.

An analog-to-digital converter 62 converts an input analog signal from the band limiting filter 52 to a digital signal.

A digital quadrature detector 61 subjects an output from the analog-to-digital converter 62 to digital quadrature detection, and outputs an IQ signal having an IF frequency equal to an output from the digital modulator 1.

A control portion 70 detects a DC offset, an IQ gain ratio, and a deviation in orthogonality, updates four distortion coefficients a', b', α', and sin θ', and outputs the updated coefficients. This detection is performed on the basis of an output from the digital modulation portion 1 and an output from the digital quadrature detector 61 under operating conditions, and on the basis of a special test signal provided to the distortion correction portion 21 from the control portion 70 and an output from the digital quadrature detector 61 under non-operating conditions (adjustment in the factory or the like).

A switch 63 connects the input of the distortion correction portion 21 to the output of the digital modulation portion 1 under operating conditions, and to a test signal outputted from the control portion 70 during adjustment in the factory.

The configuration of each component will now be described more concretely.

The digital modulation portion 1 receives, as inputs, digital complex base band signals (IQ signals) for four carriers using a chip rate (3.84 MHz) as a sampling frequency. Each digital complex baseband signal is a multi-channel composite signal multiplexed with a spread code, and because each channel has different amplitude under power control, each digital complex baseband signal can take an arbitrary value on an IQ plane. From the respective digital complex baseband signals, the root roll-off characteristic is first filtered out for the I and Q components independently using four FIR filters, and the sampling frequency is over sampled to 92.16 MHz (24 times of 3.84 MHz) while the image component is removed. Subsequently, complex multiplication of an output (IQ signal) from the FIR filter for each carrier and a complex local signal expressed by $(\cos(2\pi f_i), \sin(2\pi f_i))$, where i=1, . . . , 4 is performed. No new image is generated from this complex multiplication, and the frequency is simply converted to the IF band. Herein, f1 through f4 are, for example, 15.36, 20.36, 25.36, and 30.36 MHz, respectively. Subsequently, the complex multiplication outputs (IQ signals) of respective carriers are added and synthesized. Finally, the composite output is subjected to peak suppression processing in a limiter (the window system) that suppresses a signal in the vicinity of the peak using a weight of a window function, and thereby becomes an output from the digital modulation portion 1.

The distortion correction portion 21 has a configuration in which a DPD portion 64 and the affine transformer 2 are connected in series. The DPD portion 64 calculates instantaneous power of an input IF signal, and multiplies the input IF signal by a distortion corresponding to the power, which is read out from a distortion compensation table (LUT). The distortion compensation table stores inverse characteristics of non-linear distortions generated in the power amplifier 4 or the like. The affine transformer 2 has the same configuration as the counterpart in the related art shown in FIG. 2. The distortion compensation table in the DPD portion 64 and four affine transformation coefficients a, b, tan θ, and 1/(α cos θ) in the affine transformer 2 are updated by the control portion 70 so that distortions are lessened. Inputs to and outputs from the DPD portion 64 and the affine transformer 2 are performed in real time; however, the distortion compensation table and the coefficients may be updated through batch processing.

The analog quadrature modulator 3 has substantially the same configuration as the analog quadrature modulator 3 in the related art shown in FIG. 1. Referring to FIG. 1, a local oscillator 31 generates a sine wave in the RF band that serves as a carrier. A phase shifter 32 shifts the phase of an output from the local oscillator 31 by π/2. Multipliers 33 and 34 multiply the I-phase and the Q-phase of an output from the LPF 23 by an output from the local oscillator 31 and an output from the phase shifter 32, respectively. An adder 35 adds and synthesizes outputs from the multipliers 33 and 34. Finally, a BPF (not shown) allows only a transmission band of about 1.95 GHz in an output from the adder 35 to pass through, which is used as an output from the analog quadrature modulator 3. The analog quadrature modulator 3 is achieved by, for example, an MMIC (Microwave Monolithic Integrated Circuit). According to the method by which the I-phase and the Q-phase are subjected to digital-to-analog conversion independently for analog quadrature modulation as in this embodiment, it is possible to obtain a high C/N (Carrier-to-Noise Ratio).

Upon input of part of an output from the power amplifier 4 extracted by a coupler, the mixer 51 multiplies the input by a local signal of a local oscillator (not shown) and thereby down-converts the input to the IF frequency. The local oscillator is not necessarily identical with the local oscillator 31 in the analog quadrature modulator 3. The return system from the mixer 51 to the control portion 70 in this embodiment needs at least a bandwidth comparable to the transmission system because it also serves as the DPD, and the analog-to-digital converter 62 needs at least double the bandwidth for the digital quadrature detection to be performed. The IF in the return system is therefore set higher than the IF in the transmission system.

The band limiting filter 52 performs band limiting to remove frequency components other than those in the target IF frequency band from an output from the mixer 51 The bandwidth of the target IF frequency band is about half the sampling frequency of the analog-to-digital converter 62, and the center frequency is, for example, (¾)×92.16 MHz.

The analog-to-digital converter 62 converts an input analog signal from the band limiting filter 52 to a digital signal at the sampling frequency, 2×92.16 MHz.

The digital quadrature detector 61 multiplies an output from the analog-to-digital converter 62 by digital local signals $\cos(2\pi fb)$ and $\sin(2\pi fb)$, which are completely orthogonal and equal in amplitude, and outputs the multiplication results as the I-phase and the Q-phase. For example, fb is (½)×92.16 MHz. In addition, a second harmonic image component generated in the digital quadrature detector 61 is removed and the outputs are down-sampled to the sample rate (92.10 MHz) as high as that of the IF signal when a need arises.

Figure 4:
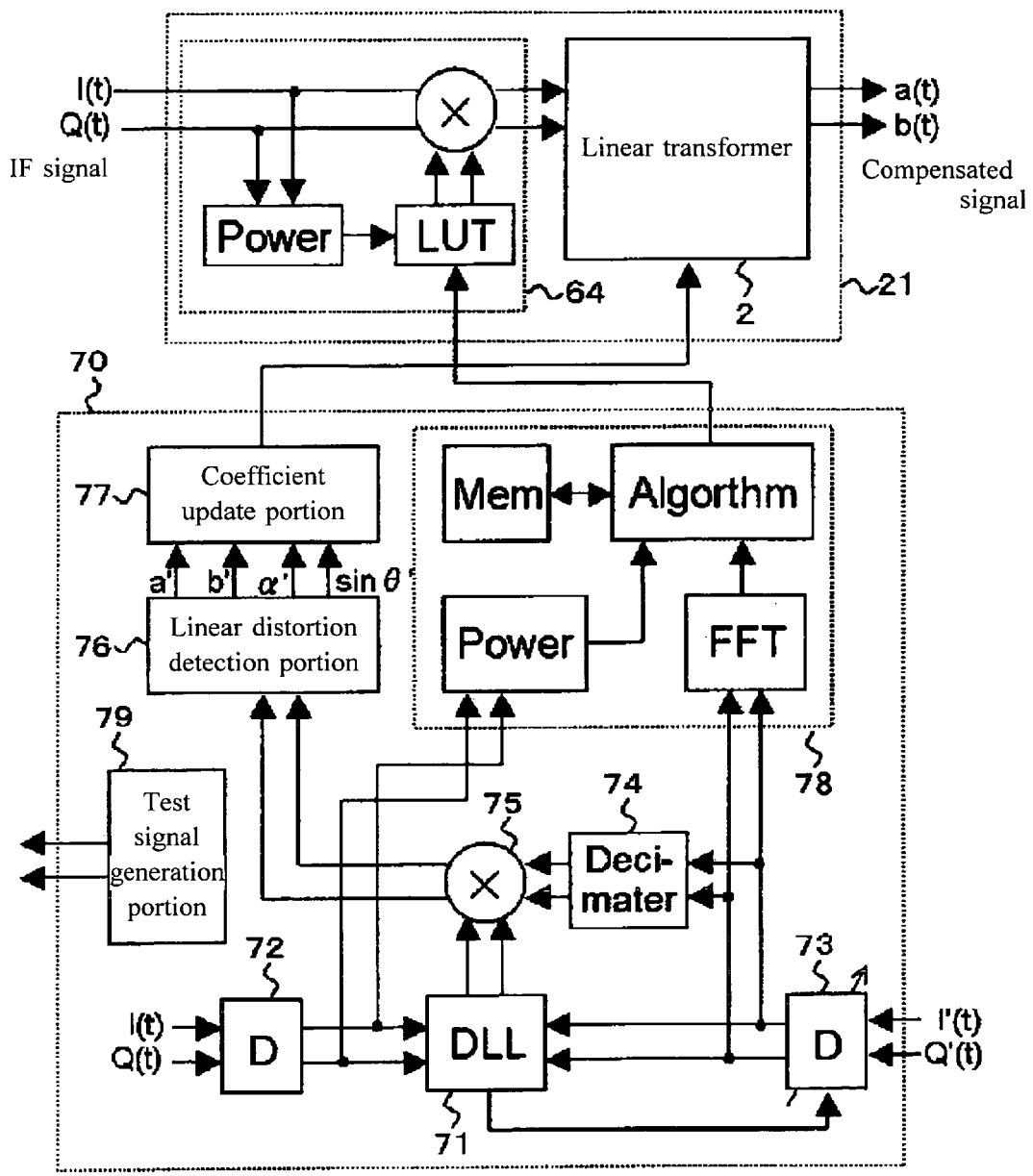
FIG. 4 is a view showing the configuration of a control portion of the first embodiment.

FIG. 4 shows the internal configuration of the control portion 70.

Buffers 72 and 73 temporarily store, respectively, inputs (IF signals I(t) and Q(t)) from the digital modulator 1 and inputs (digital quadrature detection signals I' (t) and Q' (t)) from the digital quadrature detector 61. The buffer 73 functions as a variable delay portion because its read timing is controlled.

A DLL (Delay Locked Loop) 71 reads out temporarily stored signals from the buffers 72 and 73, and controls the read (or write) timing so that a correlation between the signals reaches the maximum. A sliding correlator (SC) in the DLL 71 performs complex conjugate multiplication expressed by Equation (1) above and finds the weighted average of the multiplication results. Quotients when the real part and the imaginary part of the output from the SC are divided by the magnitude of the output from the SC correspond to $\cos \phi$ and $\sin \phi$ in Equations (2) and (3) above, respectively. In a case where local oscillation signals based on a common fundamental oscillation are used in the transmission system and in the return system, φ hardly fluctuates. Hence, $\cos \phi$ and $\sin \phi$ are not necessarily updated and outputted for each sample.

A decimeter 74 reduces the sample rate to two- to four-fold of the chip rate (that is, the sample rate of the modulating signal) by skipping digital quadrature detection signals read out by the DLL 71. Because when the sample rate is as high as or exceeds the above specified rate, calculations are merely performed repetitively for the same modulating signal. This is statistically useless and the accuracy is more or less the same.

A multiplier 75 performs computations using digital quadrature detection signals outputted from the decimeter 74 in accordance with Equations (2) and (3) above to compensate for a phase rotation.

A linear distortion detection portion 76 performs computations using outputs from the multiplier 75 in accordance with Equations (4) through (7) above, and outputs a', b', α', sin θ' for every long-term averaging time. It is understood from simulations that in order to suppress a linear distortion at or above 60 dB, it is necessary to perform long-term averaging for a length of about 5000 chips (4096 chips or more is a rough target, and about two- to four-fold is the sample number). For the long-term averaging, it is more preferable to add up all the samples after the last affine transformation coefficients are updated, and divide the sum by the sample number than using weighted averaging in terms of convergence.

A coefficient updating portion 77 performs computations in accordance with Equations (8) through (13) above to update the four affine transformation coefficients, and outputs the results. Equation (11) can be interpreted as Equation (11') below. The first approximation means a Taylor expansion, and the second approximation is achieved with sin θ≅θ and by incorporating cos $θ_n$ approximated to 1 into μ;

$$\sin θ_{n+1} = \sin(θ_n + μθ') \quad (11')$$
$$\cong \sin θ_n + \cos θ_n \cdot μθ'$$
$$\cong \sin θ_n + μ \sin θ'$$

Other approximations such that can provide appropriate approximation in θ→0 and α→1 can be used when a need arises. In this embodiment, four affine transformation coefficients a, b, tan θ, and 1/(α cos θ) are not updated directly from distortion coefficients a', b', α', and sin θ' representing residual distortions that cannot be compensated completely in the affine transformer 2. Herein, parameters $a_n$, $b_n$, $α_n$, and sin $θ_n$, representing inverse characteristics of distortions (or distortions per se) in the quadrature modulator 3, are updated so that they are approximated to true values, and affine transformation coefficients are determined uniquely from the parameters thus found. In short, the affine transformation coefficients are updated via parameters.

A DPD control portion 78 receives, as inputs, signals in the transmission system and the return system, both having delays made equal in the DLL 71, and performs adaptive control that updates the LUT, so that a distortion component contained in a signal in the return system becomes minimum. FIG. 4 shows a case where a signal in the return system is subjected to FFT (Fast Fourier Transformation), and the out-band power is evaluated as a distortion component. However, the invention is not limited to this configuration, and a difference between signals in the transmission system and the return system may be detected as an error vector.

A test signal generation portion 79 generates a test signal used to detect distortions under non-operating conditions. Although it will be described in detail below, the test signal can be provided either to the digital modulation portion 1 as a baseband signal or to the distortion correction portion 2 as an IF signal.

Figure 5:
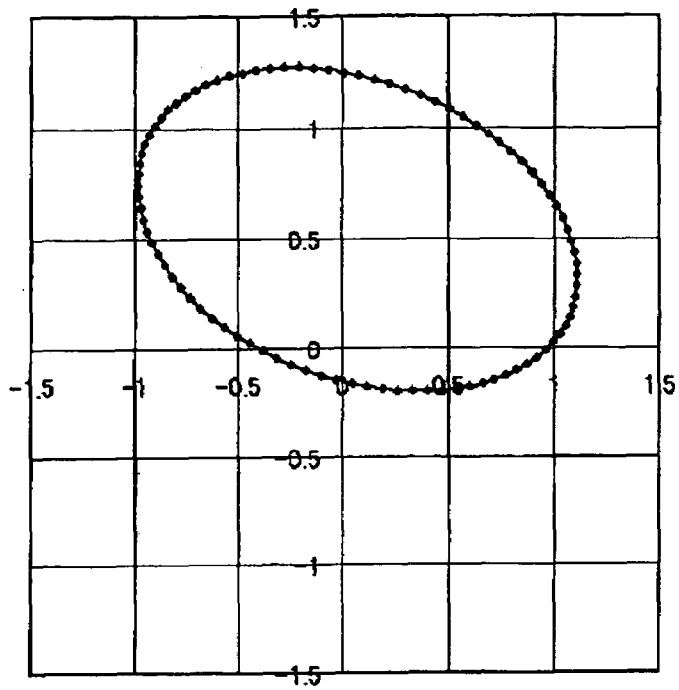
FIG. 5 is a view showing a signal before distortion compensation through simulations of the first embodiment.
Figure 6:
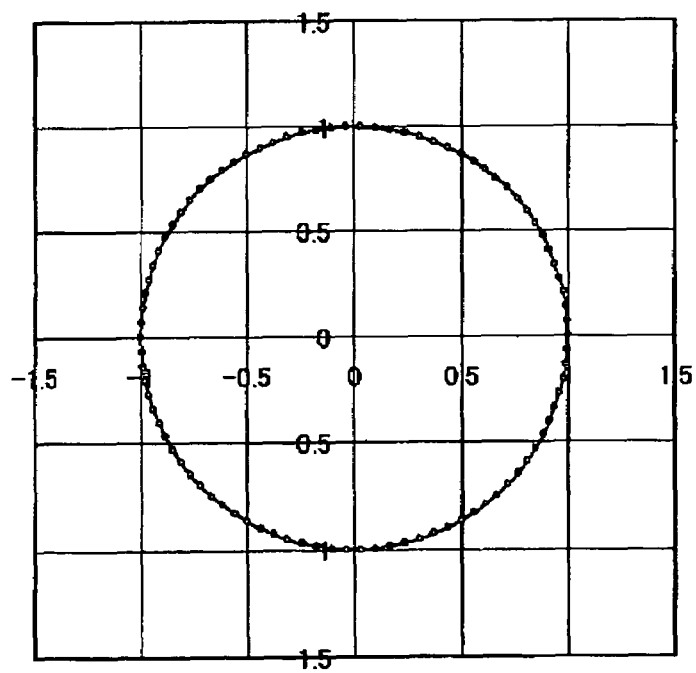
FIG. 6 is a view showing a signal after distortion compensation through simulations of the first embodiment.

A case where distortion compensation is carried out using updating Equations (8) through (13) above will now be described. FIG. 5 shows a case where I(t)=cos ωt, and Q(t)=sin ωt are transmitted in the presence of distortions (quantities of distortion: a'=0.3, b'=0.7, α=0.8, and θ=−π/8). FIG. 6 shows a simulation result when the distortion compensation proposed herein was carried out. It is confirmed that by updating the affine transformation coefficients from time to time using μ=1/64 and m=2 as coefficients, it is possible to ultimately achieve C/N=60 dB or above.

A distortion compensation coefficient updating algorithm using a special signal, which is the characteristic of this embodiment, will now be described.

Generally, a delay, a level difference, and a phase difference occur between signals in the transmission system and the return system shown in FIG. 3, and their values are unknown because the analog circuit is incorporated. A delay and a level difference can be detected and corrected independently. However, a phase difference cannot be detected correctly in the presence of a DC offset, an IQ gain ratio, and a deviation in orthogonality. Conversely, a DC offset, an IQ gain ratio, and a deviation in orthogonality cannot be detected correctly in the presence of a phase difference. Hence, the distortion compensation quadrature modulator, described in DETAILED DESCRIPTION OF THE INVENTION above, finds a phase difference φ first, and then corrects four error items including DC offsets a and b, an IQ gain ratio α, a deviation in orthogonality, θ, and the phase difference θ gradually until they are refined to optimum values. However, according to the method by which four error items are refined together to optimum values gradually, in a case where corrections are started when the errors are unknown, it takes longer to detect respective errors (convergent times of detection values).

To avoid this inconvenience, distortion detection is carried out directly using a test signal of a rectangular wave in this embodiment. A distortion detecting method using a rectangular wave signal will be described independently for (i) DC offset, (ii) IQ gain ratio, and (iii) deviation in orthogonality.

(i) Detecting Method of DC Offset

Figure 7:
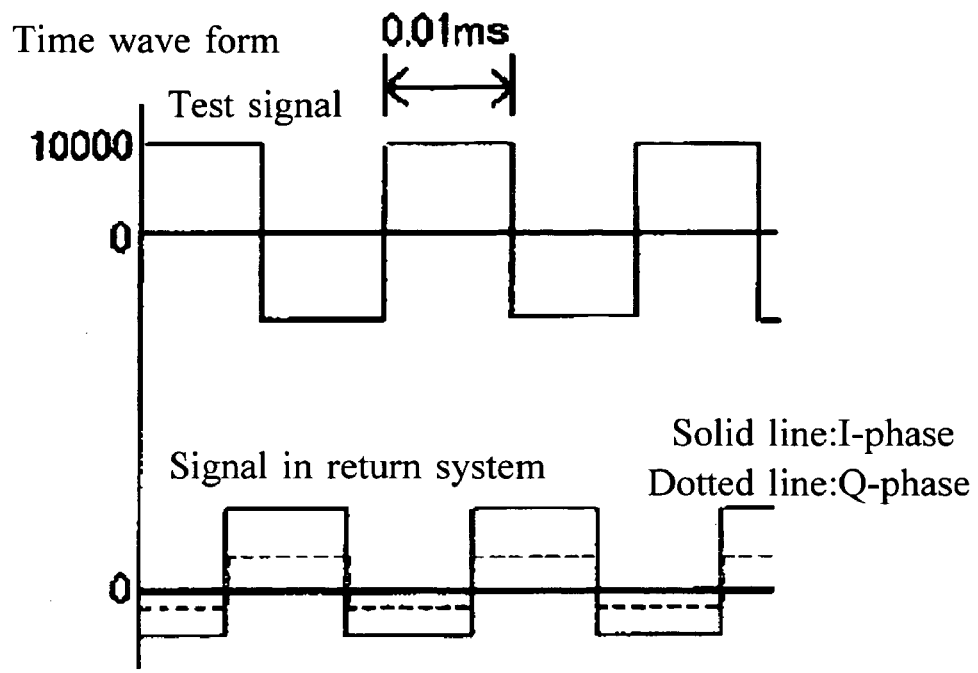
FIG. 7 is a time wave form chart of a test signal and a signal in a return system used to detect a DC offset under non-operating conditions of the first embodiment.
Figure 8:
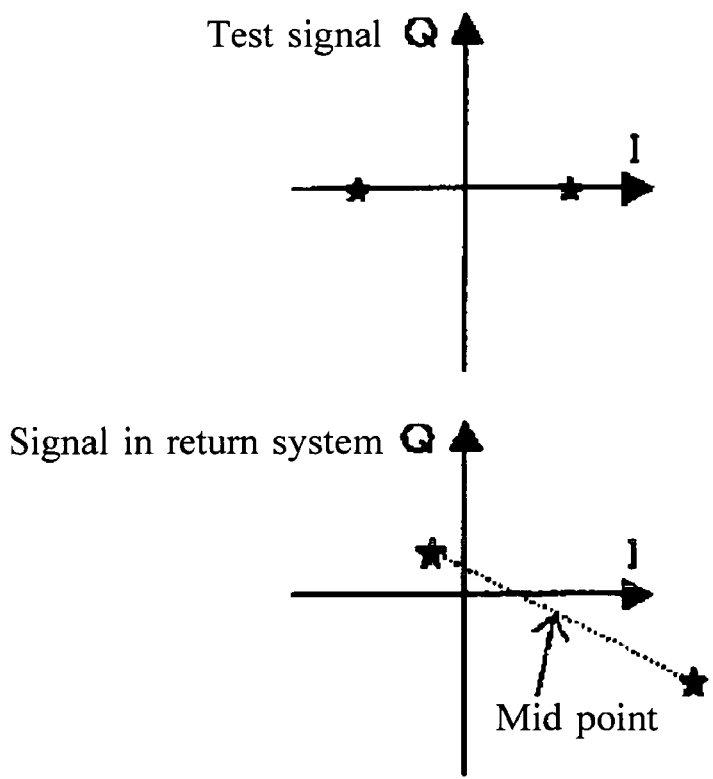
FIG. 8 is a view showing placement of signal points of a test signal and a signal in the return system used to detect a DC offset under non-operating conditions of the first embodiment.

Initially, a test signal as shown in FIG. 7 is transmitted as an input signal. The amplitude and the cycle of a rectangular wave are chosen to best suit the transmission amplifier device system. A signal in the return system having undergone quadrature detection is a rectangular wave signal that is phase-shifted with respect to the transmission signal. As is shown in FIG. 8, two points at symmetric positions with the original point in between on the I-axis (or the Q-axis, either can be used) on an IQ plane are transmitted as the transmission signal. These two points map on the phase-shifted positions (coordinates) in the return system because a DC offset is superimposed. Hence, magnitude of the DC offset can be found by finding a mid point of the two points of the signal in the return system. When the magnitude of the DC offset is found, the same rectangular wave signal is transmitted again by setting a vector of this magnitude at a given phase. Then, a phase when the mid point of the two points of the signal in the return system comes to the closest vicinity of the original point is the phase of the DC offset. The DC offset values of the I-phase and the Q-phase can be therefore determined from the magnitude and the phase of the DC offset thus detected. The mid point may be found by averaging average values of the respective two points through symbol judgment of any given two points. Alternatively, given an average time (for example, a multiple of the cycle of the rectangular wave) such that makes appearance probabilities of the two points equal, the mid point may be a mere average value of all the samples measured. In addition, a rough value of a delay is found by measuring a delay time between the test signal and the signal in the return system as to the rising of the rectangular wave, which can be provided to the DLL 71 as an initial value.

Figure 12:
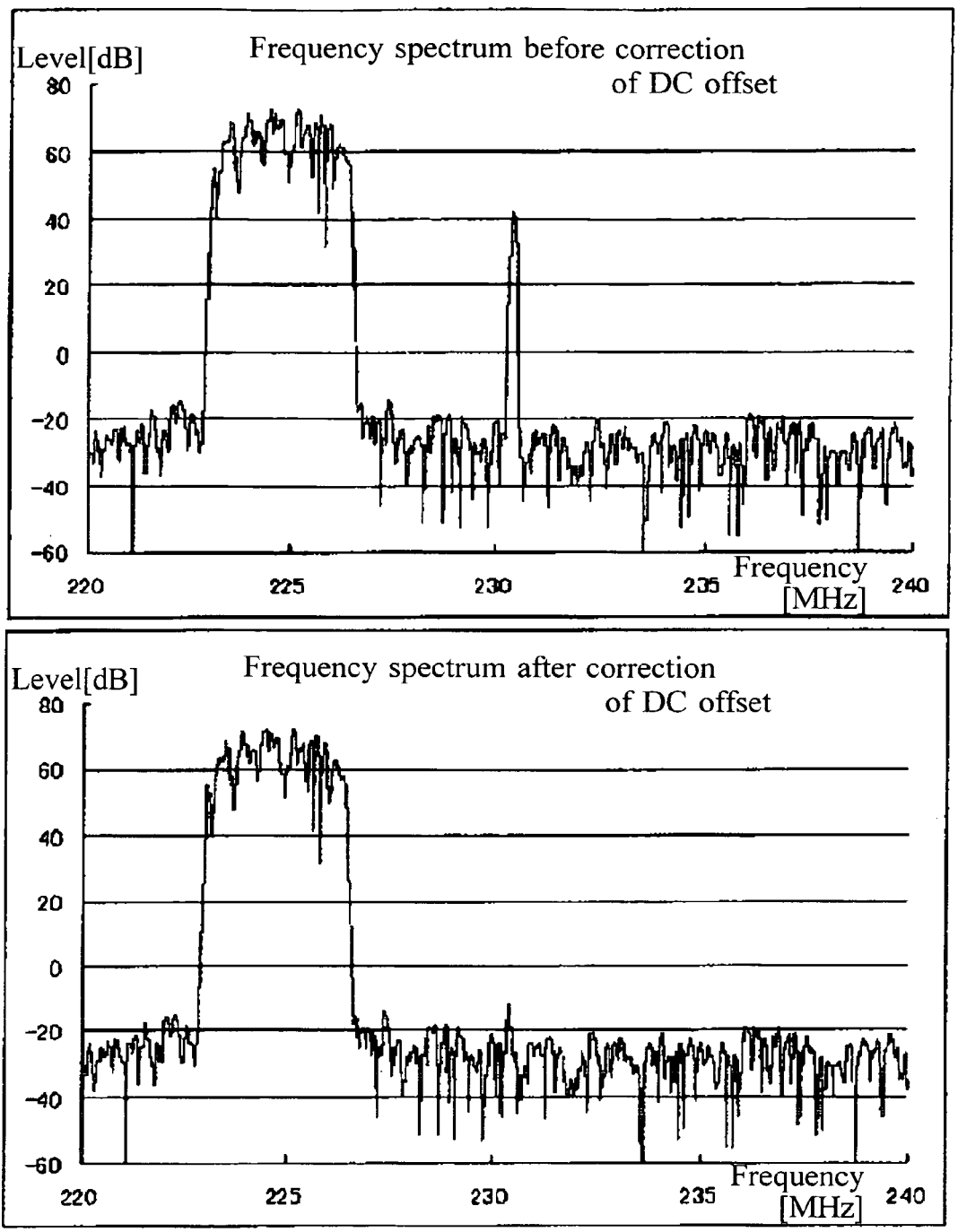
FIG. 12 shows frequency spectral charts before and after DC offset correction under non-operating conditions of the first embodiment.

FIG. 12 shows frequency spectral maps before and after the DC offset is corrected. These spectral maps are frequency spectral maps of an output signal from the analog quadrature modulator obtained from simulations on the calculator. Herein, 1-carrier W-CDMA signal is used (carrier frequency: 224.64 MHz). It is understood that a DC component (it appears due to the presence of the DC offset) appearing in the spectrum before the correction at the position of the center frequency, 230.4 MHz, is dropped to a level near the noise floor after the correction.

(ii) Detecting Method of IQ Gain Ratio

Figure 9:
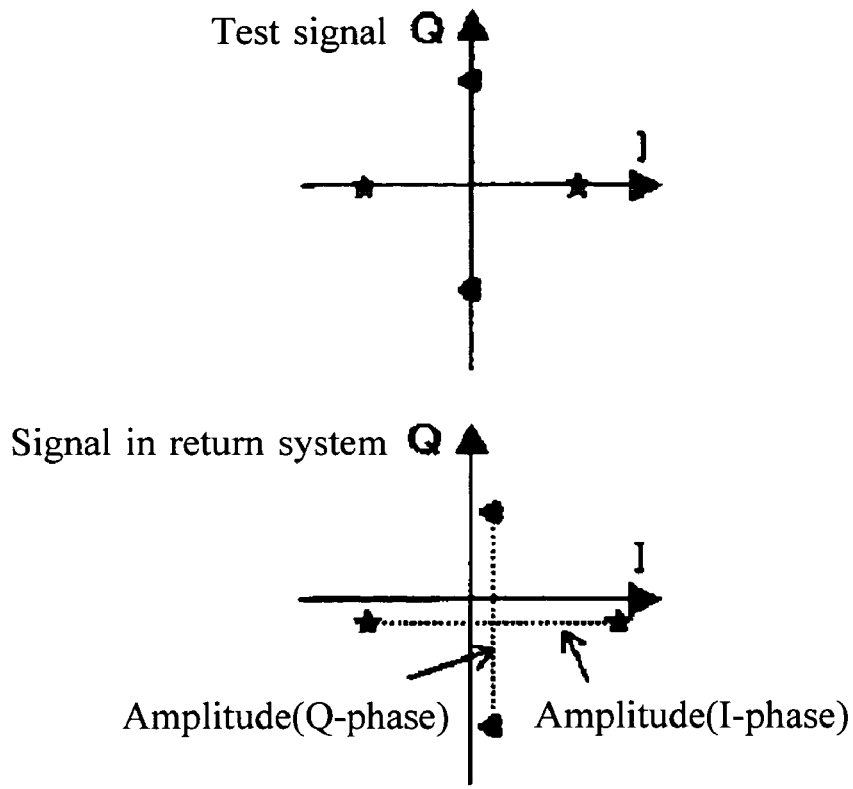
FIG. 9 is a view showing placement of signal points of a test signal and a signal in the return system used to detect an IQ gain ratio under non-operating conditions of the first embodiment.

The same test signal as the one used in the DC offset detection as shown in FIG. 7 is transmitted once for each of the I-phase and the Q-phase as an input signal. As is shown in FIG. 9, a distance between two points on the IQ plane detected in the return system when a rectangular wave signal in the I-phase alone is transmitted is detected as an I-phase gain. Likewise, a distance between two points on the IQ plane detected in the return system when a rectangular wave signal in the Q-phase alone is transmitted is detected as a Q-phase gain. An IQ gain ratio is detected by finding a ratio between the I-phase gain and the Q-phase gain.

Figure 13:
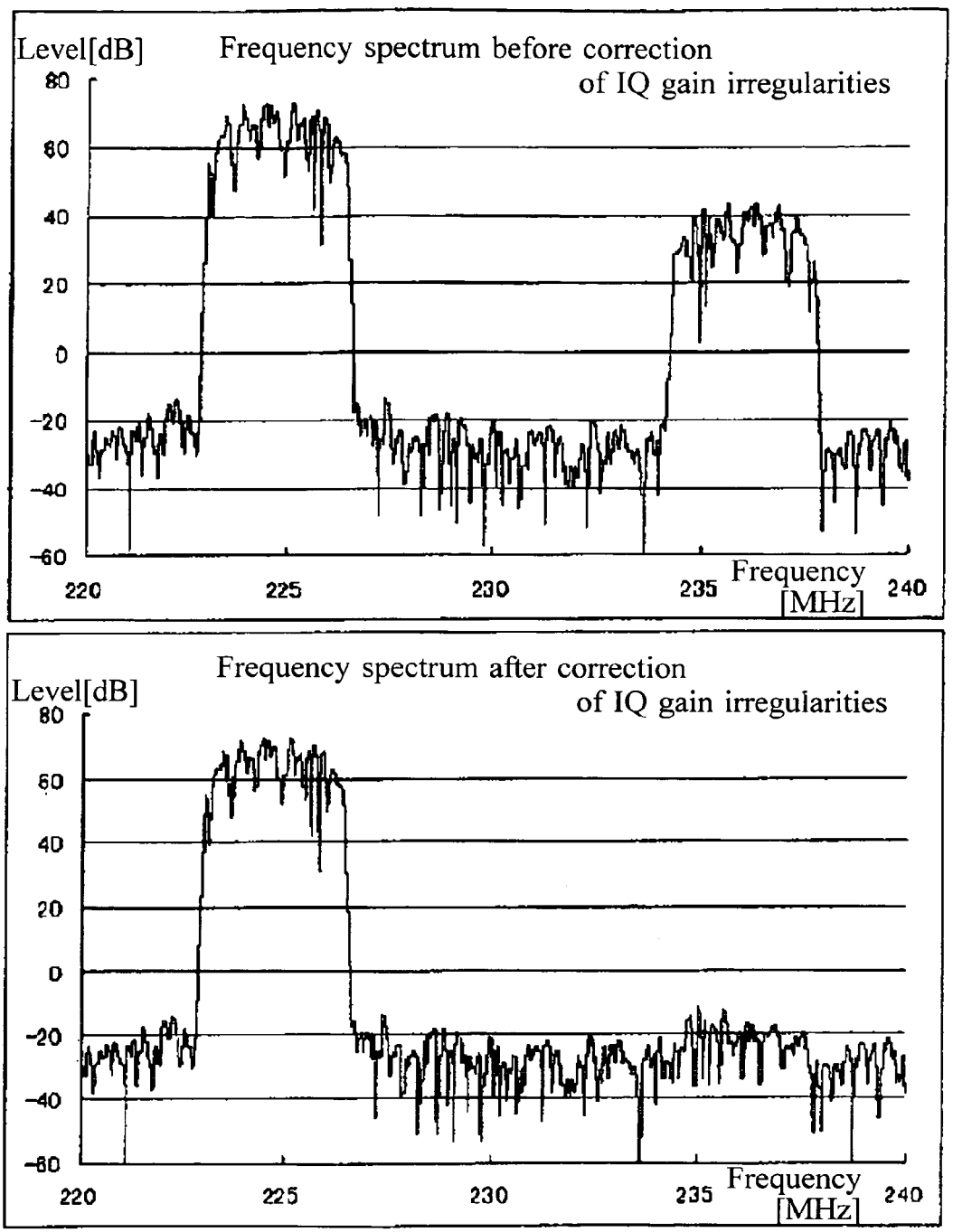
FIG. 13 shows frequency spectral charts before and after correction of an IQ gain ratio under non-operating conditions of the first embodiment.

FIG. 13 shows frequency spectral maps before and after the IQ gain ratio is corrected. As with the spectral maps of FIG. 12, these spectral maps are also obtained from simulations on the calculator. It is understood that the component (it appears with an IQ gain ratio) appearing in the spectrum before the correction at the frequency (236.16 MHz) on the opposite side with respect to the center frequency, 230.4 MHz, is dropped to a level near the noise floor after the correction.

(iii) Detecting Method of Deviation in Orthogonality

Figure 10:
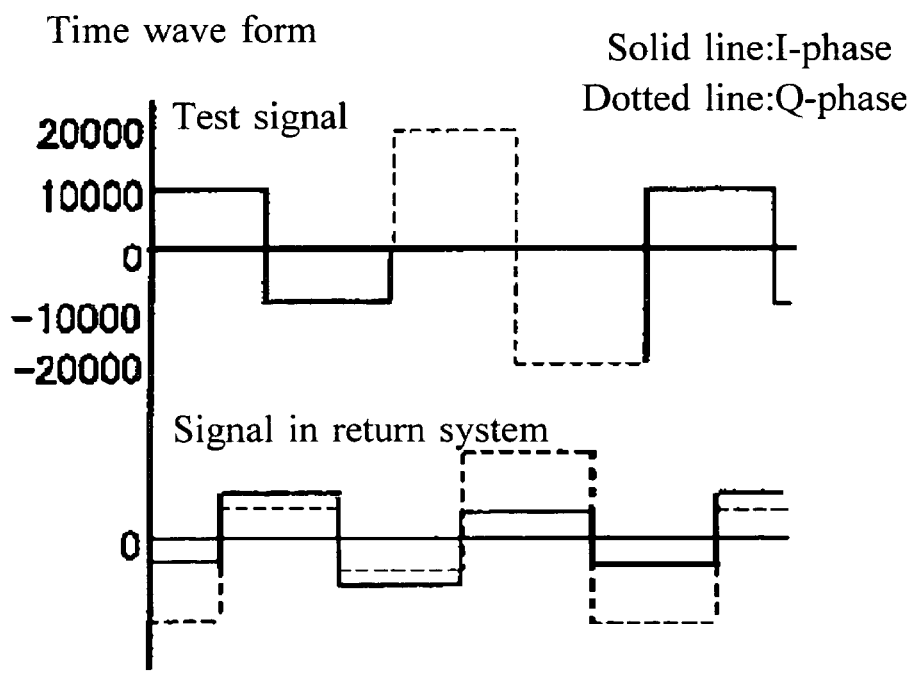
FIG. 10 is a view showing placement of signal points of a test signal and a signal in the return system used to detect a deviation in orthogonality under non-operating conditions of the first embodiment.
Figure 11:
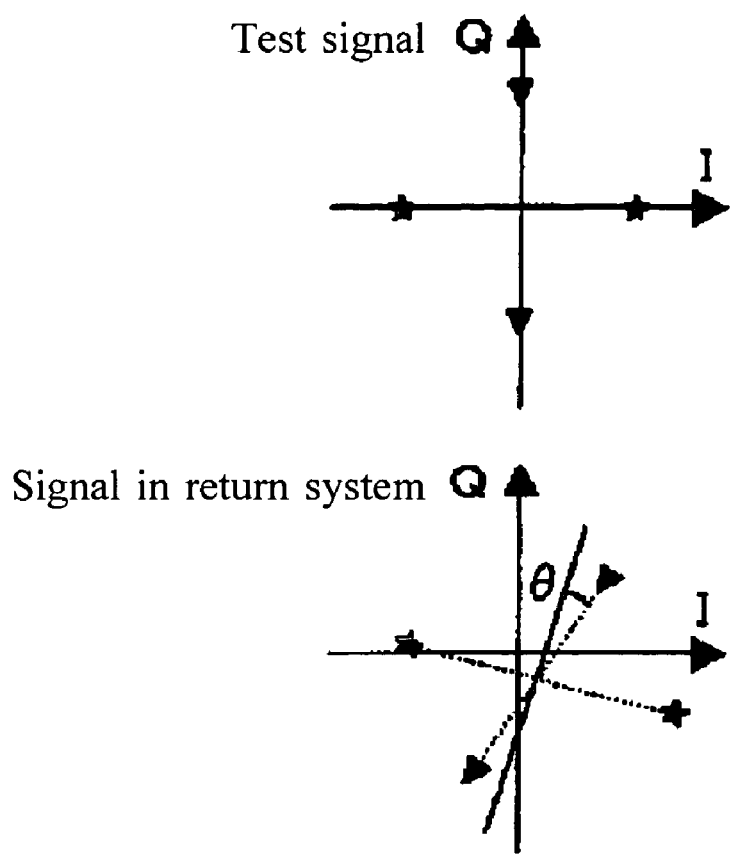
FIG. 11 is a time wave form chart of a test signal and a signal in the return system used to detect a deviation in orthogonality under non-operating conditions of the first embodiment.

A rectangular wave signal, in which the I-phase and Q-phase are oscillated alternately at different amplitudes for every cycle as is shown in FIG. 10, is transmitted as an input signal. In the return system, four points are detected on the IQ plane as is shown in FIG. 11. Because a line linking the two points on the I-phase side and a line linking the two points on the Q-phase side have a deviation in orthogonality (the I-phase and the Q-phase are distinguishable from a difference of the amplitude values), a deviation in orthogonality, θ, can be detected from the coordinates of the four points.

To be more concrete, a differential vector between two points is found in each of the I-phase and the Q-phase, and $\cos(\pi/2-\theta)=\sin\theta$ can be obtained by normalizing (bringing the magnitude to 1) a scalar product of the differential vector. There is no problem in practice by distinguishing the I-phase from the Q-phase on the basis of a distance from the signal point to the original point. However, when sin θ takes a value close to 0, the I and Q judgment for the signal points at the second and third closest distances from the original point are changed. Alternatively, they can be readily distinguished by bringing them into correspondence with the transmission timing of the test signal.

Figure 14:
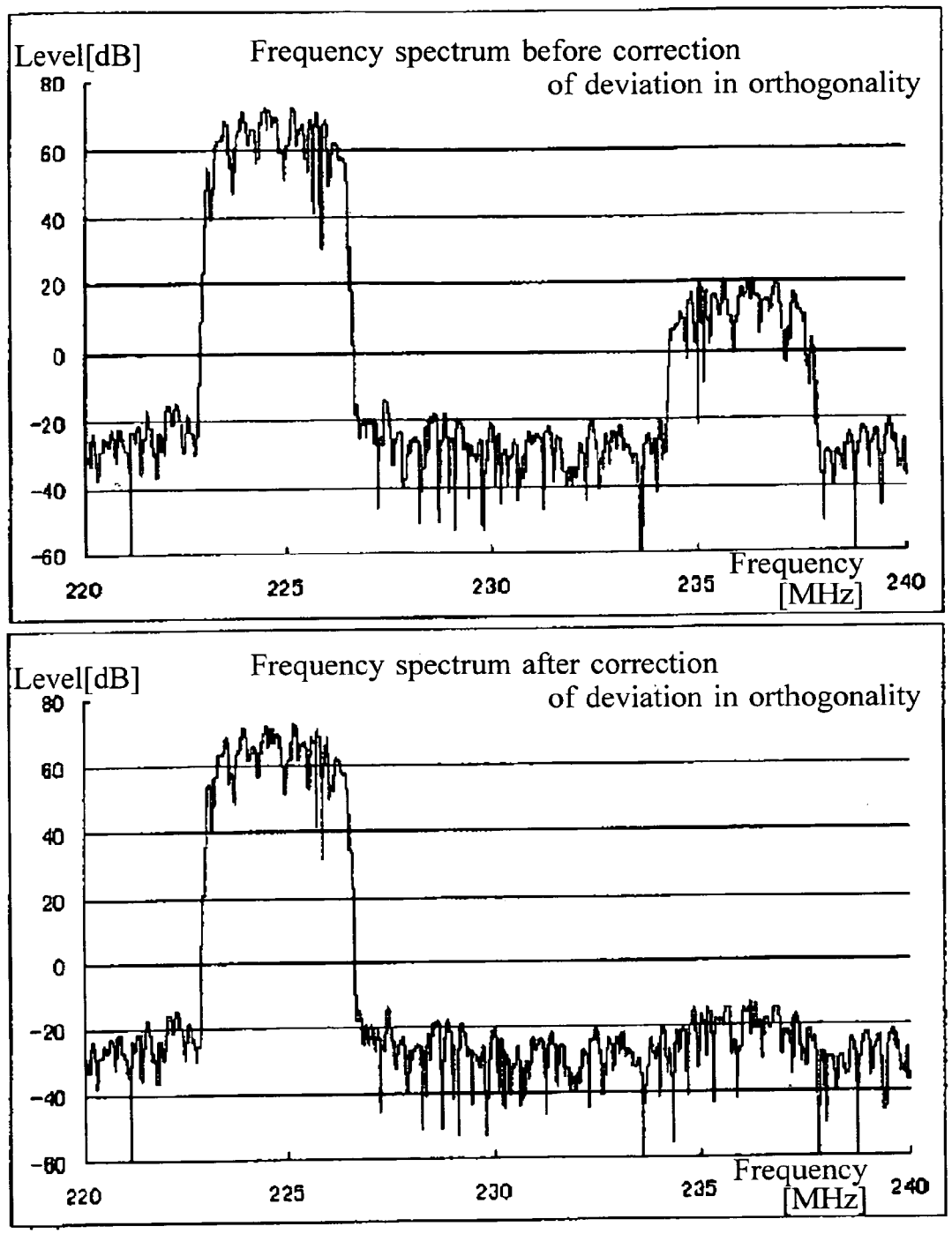
FIG. 14 shows frequency spectral charts before and after correction of a deviation in orthogonality under non-operating conditions of the first embodiment.
Figure 15:
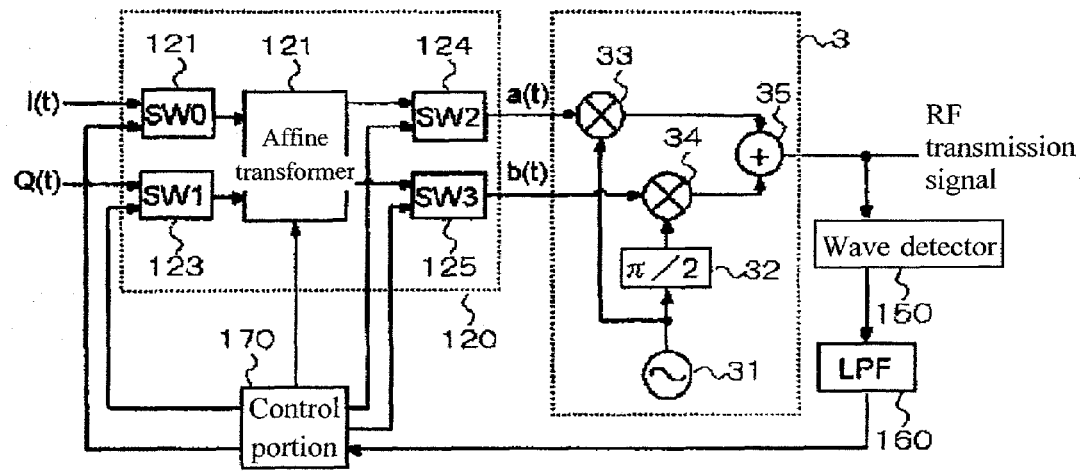
FIG. 15 is a view showing the configuration of a distortion compensation quadrature modulator in the related art.

FIG. 14 shows frequency spectral maps before and after a deviation in orthogonality is corrected. As with the spectral maps of FIG. 12, these spectral maps are also obtained from simulations on the calculator. It is understood that the component (it appears with a deviation in orthogonality) appearing in the spectrum before the correction at the frequency (236.16 MHz) on the opposite side with respect to the center frequency, 230.4 MHz, is dropped to a level near the noise floor after the correction.

According to this embodiment, by using a rectangular wave signal, it is possible to detect and correct a DC offset, an IQ gain ratio, and a deviation in orthogonality in a shorter time than in the related art under non-operating conditions. Also, because a phase difference and a DC offset can be detected independently, detection can be more accurate. A phase difference alone can be detected and corrected after a DC offset, an IQ gain ratio, and a deviation in orthogonality are corrected. In addition, the affine transformation coefficients are always kept at values currently deemed as most appropriate under operating conditions. Hence, in comparison with a method by which a change of residual distortions is detected using a lock-in amplifier by perturbing the affine transformation coefficients, residual distortions at convergence are lessened. This embodiment can be therefore suitably applied to a base station apparatus of mobile communications for which a signal quality is strictly regulated.

Second Embodiment

A second embodiment will describe that distortions can be corrected using affine transformation other than the one described in DETAILED DESCRIPTION OF THE INVENTION above. The affine transformation carried out in the affine transformer of FIG. 2 and linear distortions generated in the analog quadrature modulator are generally expressed by Equations (14) and (15) as follows:

$$\begin{pmatrix} a \\ b \end{pmatrix} = \begin{pmatrix} l_{11} & l_{12} \\ l_{21} & l_{22} \end{pmatrix} \begin{pmatrix} I \\ Q \end{pmatrix} + \begin{pmatrix} a' \\ b' \end{pmatrix} \quad (14)$$

$$\begin{pmatrix} I' \\ Q' \end{pmatrix} = \begin{pmatrix} m_{11} & m_{12} \\ m_{21} & m_{22} \end{pmatrix} \begin{pmatrix} a \\ b \end{pmatrix} + \begin{pmatrix} c \\ d \end{pmatrix} \quad (15)$$

Figure 2:
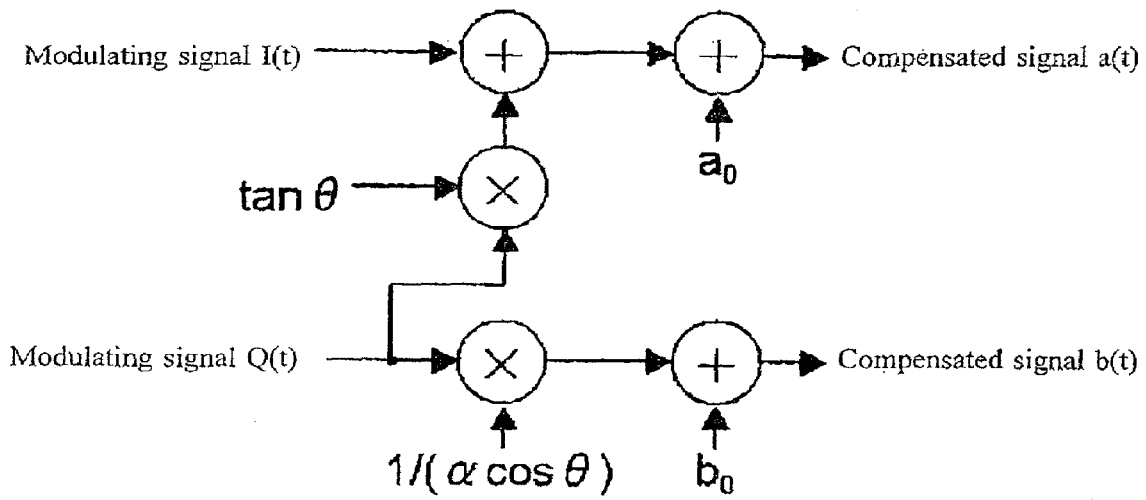
FIG. 2 is a view showing the configuration of an affine transformer in the related art and of the invention.

An object of the invention is to find a compensation matrix, $L=[l_{ij}]$ that compensates for a linear distortion in the analog quadrature modulator expressed by Equation (15) above, that is, a DC offset, an IQ gain ratio, and a deviation in orthogonality. DC offsets c and d can be removed by a' and b', which are obtained by subjecting c and d to linear transformation using L and multiplying the results by −1. It is therefore readily understood that the distortion compensation matrix L remains unsusceptible even when the DC offsets vary. Hence, by neglecting the DC offsets for ease of description, an object of the invention can be said to find a matrix L such that makes a product ML of the matrix L and a distortion matrix, $M=[m_{ij}]$, an orthogonal matrix (orthogonal transformation). By finding $L=M^{-1}$, then ML=E (unit matrix) is an orthogonal matrix. Thus, let M be a matrix having 1 and o as elements of one arbitrary row or column (this is equivalent to ML of which a degree of freedom in magnitude and rotation is deprived). Then, given, for example, $$M = \begin{pmatrix} 1 & m_{12} \\ 0 & m_{22} \end{pmatrix}, L = \begin{pmatrix} 1 & l_{12} \\ 0 & l_{22} \end{pmatrix} \quad (16)$$

we get $l_{12}=-m_{21}m_{22}$, $l_{22}=1/m_{22}$. It is therefore understood that linear transformation in FIG. 2 is inverse transformation of a liner distortion given by $m_{12}=-\alpha \sin\theta$, $m_{22}=\alpha \cos\theta$. Also, given $$M = \begin{pmatrix} 1 & \frac{\tan\theta}{\alpha} \\ 0 & \frac{\cos\theta}{\alpha} \end{pmatrix}, L = \begin{pmatrix} 1 & -\sin\theta \\ 0 & \alpha\cos\theta \end{pmatrix} \quad (17)$$

we also get ML=E. Further, given $$M = \begin{pmatrix} 1 & 0 \\ m_{21} & m_{22} \end{pmatrix}, L = \begin{pmatrix} 1 & 0 \\ l_{21} & l_{22} \end{pmatrix} \quad (18)$$

we get $l_{21}=-m_{21}/m_{22}$, $l_{22}=1/m_{22}$, and hence ML=E. FIG. 2 can be thus replaced by linear transformation given by $l_{21}=\tan\theta$, and $l_{22}=1/(\alpha \cos\theta)$, $m_{21}=-\alpha \sin\theta$, $m_{22}=\alpha \cos\theta$.

Various types as described above are available, and there is a difference depending on methods for measuring θ, that is, whether an orthogonal state is shifted by θ or coordinates shifted by θ are brought into an orthogonal state. Generally, θ takes different values in the former and latter measuring methods. For example, in Equation (17) above, when a reciprocal number of a is found by inverting a symbol of θ in M, it does not coincide with L; however, they coincide when θ→0 and α→1.

The compensation matrix L is not necessarily an inverse matrix of the distortion matrix M. For M in Equation (16) above, ML can be an orthogonal matrix with L given by $l_{11}=1$, $l_{12}=-m_{21}$, $l_{21}=0$, $l_{22}=(1+m_{21}^2)/m_{22}$, or $l_{11}=\{-l_{12}(m_{22}+m_{21}l_{12})/m_{21}\}^{1/2}$, $l_{12}=-m_{21}m_{22}/(1+m_{22}^2)$, $l_{21}=0$, $l_{22}=1$. Conversely, for an arbitrary distortion matrix M, L in Equation (16) above can make ML an orthogonal matrix (magnitude is not normalized). M and L used in the invention can therefore adopt an arbitrary type. For a distortion M given by, for example, $m_{21}=-\alpha \sin\theta$, $m_{22}=\alpha \cos\theta$, we get $$L = \begin{pmatrix} 1 & \alpha\cos\theta \\ 0 & \frac{1+\alpha^2\sin^2\theta}{\alpha\cos\theta} \end{pmatrix} \quad (19)$$

However, an equation tends to be complicated in comparison with L of an inverse matrix even when approximation, such as $1/\cos\theta=2-(1-\sin 2\theta)$, is used.

In practice, for an unknown M, two elements are fixed to 1 and 0 as in Equation (16) above, and sin θ is compensated for with a matrix L that uses a as a parameter. However, when an L is found ultimately through repetitive calculations as in DETAILED DESCRIPTION OF THE INVENTION above, a correction value of L may fail to make ML an orthogonal matrix exactly for all θ and α. In short, any L can be used as long as it can approximate ML to an orthogonal matrix as close as possible at convergence (θ→0 and α→1). Hence, a difference of the measuring methods of θ does not raise a problem, and a matrix L that is easy to calculate as in DETAILED DESCRIPTION OF THE INVENTION above is preferable.

In principle, current L(n) is updated to L(n+1) by multiplying L(n) by newly found L' (correction value) from the left.

The current $a_n$ and $b_n$ are then updated to $a_{n+1}$ and $b_{n+1}$ by adding linear transformation $L^{-1}(n+1)$ of newly found a' and b' to $a_n$ and $b_n$.

In DETAILED DESCRIPTION OF THE INVENTION above, the inverse characteristic of a total of distortions in the quadrature modulator 3 is used as a parameter, and the true value of the parameter is found first through repetitive calculations, which is then converted uniquely to an affine transformation coefficient.

Alternatively, for example, a simple function f(θ, α) such that has 0 when θ=0 and α=1 and has derivatives (partial differential coefficients of θ and α) of the same symbol as L' (or L(n+1)=L'L(n)) in the vicinity thereof with the magnitude of the derivatives being smaller than the product of the derivatives of L and the step size µ or the like, may be directly added to the current L(n) as another approximation. For f(θ, α), any approximation can be used provided that convergence is sufficiently accurate in the vicinity of θ=0 and α=1. For example, Equations (10) through (13) above can be replaced by updating equations as follows:

$$L(n+1) \approx L(n) + \begin{pmatrix} 0 & 0 \\ \mu\sin\theta & m(1-\alpha) \end{pmatrix}, L(0) = \begin{pmatrix} 1 & 0 \\ \tan\theta_0 & \frac{1}{\alpha_0\cos\theta_0} \end{pmatrix} \quad (20)$$

The initial value of L(0) is found in the same manner as in DETAILED DESCRIPTION OF THE INVENTION above.

Third Embodiment

Figure 19:
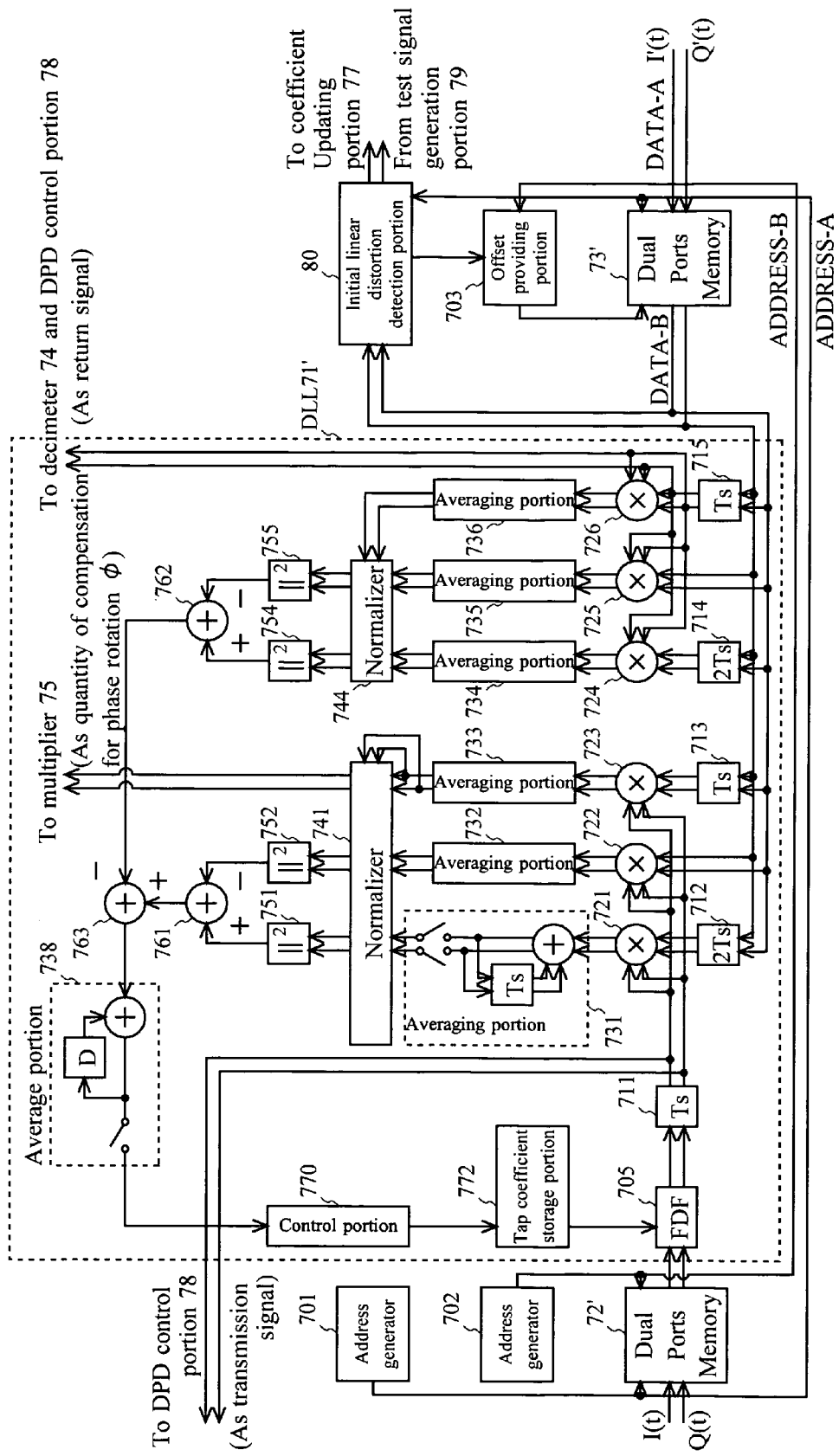
FIG. 19 is a view showing an example of the configuration of a DLL and a periphery thereof.

A third embodiment will describe more in detail the configuration of the DLL 71 described in the first embodiment above and the periphery thereof. FIG. 19 is a view showing the configuration of a DLL 71' of this embodiment and the periphery thereof. Because highly accurate delay coincidence is carried out between signals in the transmission system and the return system, which is necessary to detect linear distortions, this embodiment is characterized in that a fractional delay filter (FDF) is provided. Although descriptions will be given with reference to FIG. 19, the configuration of this embodiment is the same as the configuration shown in FIG. 4 unless specified otherwise.

Numerals 72' and 73' denote dual port memories (DPM) and correspond, respectively, to the buffers 72 and 73 of the first embodiment above. Each dual port memory has two ports A and B comprising an address bus and a data bus, and an access is enabled from each port independently. The DPM 72' and DPM 73' respectively receive, as inputs, IF signals I(t) and Q(t) and digital quadrature detection signals I(t)' and Q(t)' at the ports A, and store these signals at the same addresses using write addresses provided commonly from an address generator 701. This operation is carried out constantly.

An address generator 702 provides read addresses to the ports B of the DPM 72' and DPM 73'. It should be noted, however, that an offset providing portion 703 provides an offset to an address given to the DPM 73', and a relative delay time between signals temporarily stored in the DPM 72' and DPM 73' and read out therefrom can be varied by adjusting this offset.

An FDF 705 comprises FIR (Finite Impulse Response) filters provided independently for the I-phase and the Q-phase, and upon input of a signal read out from the DPM 72', it outputs the signal by providing a delay almost as long as a time of the sample number, which is half the tap number. The delay time is determined depending on the tap coefficient given, and the delay time is controlled by a unit equal to or less than one sample time by a known method.

A delay 711 provides a delay to an output from the FDF 705 by one sample time (Ts), and outputs the signal to the DLL mainbody and the DPD control portion 78 (see FIG. 4) as a signal in the transmission signal. The delay 711, however, can be omitted.

A delay 715 provides a delay to an output from the DPM 73' by one sample time (Ts), and outputs the signal to the decimeter 74 (see FIG. 4), the DPD control portion 78 and the like as a signal in the return system.

The DLL main body adjusts a delay time set in the FDF, so that a difference between cross correlated value powers purposely shifted by ±Ts from the signal in the transmission system and the signal in the return system is 0.

Initially, the delays 712 and 713 output an output from the DPM 73' with delays of 2Ts and Ts, respectively. Then, multipliers 721 through 723 perform complex multiplication of the output from the delay 711, and the outputs from the delay 712, the DPM 73', and the delay 713, respectively, and output the results.

Averaging portions 731 through 733 accumulatively add up a predetermined sample number (for example, 256) of outputs from the multipliers 721 through 723, and output the results as late path, early path, and normal path correlated values. The averaging portion 731 through 733 and 734 through 736 are of the same configuration and the internal configuration of the averaging portion 731 alone is shown in the drawing.

A normalizer 741 normalizes magnitudes of the respective correlated values outputted from the averaging portions 731 through 733 on the basis of the magnitude of the normal path correlated value outputted from the averaging portion 733, and outputs the result. The correlated value is thus approximated to an amplitude-independent value that reflects a delay time error alone. Also, because the I-phase takes cos $\phi$ and the Q-phase takes sin $\phi$, the normalized normal path correlated value is outputted to the multiplier 75 (see FIG. 4) as a quantity of compensation for a phase rotation $\phi$.

Upon input of the late path and early path correlated values normalized in the normalizer 741, power portions 751 and 752 calculate sums of squares of the I-phase and the Q-phase, and output the results.

An adder 761 subtracts the early path correlated value power outputted from the power portion 752 from the late path correlated value power outputted from the power portion 751, and outputs the result. The output from the adder 761 takes a positive value when a signal in the transmission system is behind a signal in the return system, and a negative value when the former is ahead the latter.

Delays 714 and 715, multipliers 724 through 726, averaging portions 734 through 736, a normalizer 744, power portions 754 and 755, and an adder 762 are configured in the same manner as above, and a difference between correlated value powers is calculated for autocorrelation as well, which is outputted from the adder 762.

An adder 763 subtracts an output from the adder 762 from an output from the adder 761, and outputs the result. Because autocorrelation is not completely 0 even for a CDMA signal, the cross correlated value is approximated to a value that reflects a delay time error alone by removing an autocorrelation component through subtraction.

An averaging portion 738 accumulatively adds up a predetermined number (for example, 8) of outputs from the adder 763, and outputs the result.

A control portion 770 judges the symbol of an output from the averaging portion 738, and outputs an instruction signal such that reduces the delay to be set in the FDF 705 by a predetermined quantity (for example, Ts/4) when the symbol is plus, and increases the delay by a predetermined quantity when the symbol is minus. When such an increase or a decrease exceeds a variable range of the FDF 705, the quantity of offset set in the offset providing portion 703 may be controlled.

A tap coefficient storage portion 772 stores tap coefficients corresponding to various delay times, and sets the tap coefficient in the FDF 705 according to an instruction from the control portion 770. In this embodiment, the tap coefficient in the FDF 705 is updated for every 256×8=2048 samples.

As has been described in the first embodiment above, an initial linear distortion detection portion 80 calculates initial values $a_0$, $b_0$, $\alpha_0$, and sin $\theta_0$ of the affine transformation parameters using a test signal (including a signal corresponding to an impulse and a silence signal as in a fourth embodiment described below) under non-operating conditions, and outputs the results to the coefficient updating portion 77. To be more specific, the initial linear distortion detection portion 80 receives, as inputs, a write address in the DPM 73', a read signal, and a timing signal of a test signal from the test signal generation portion 79, and provides a read address corresponding to the write address used when the timing signal is inputted to the DPM 73' via the offset providing portion 703. Then, it calculates initial values of the parameters by averaging read signals from the DPM 73' or averaging signals for each judged symbol. In addition, it roughly detects a difference of delay times between signals in the transmission system and the return system, and sets a quantity of address offset corresponding to a delay time thus detected to the offset providing portion 703.

In comparison with Tc/2 (half the reciprocal number of the sample rate) normally provided to the late path and the early path as a time difference, Ts (the reciprocal number of the sample rate, for example, 1/184.32 MHz) provided in the DLL 71' of this embodiment is significantly small. A time difference provided to each path is not limited to Ts; however, it is preferable that a time difference is twice or less the reciprocal number of the bandwidth of the IF signals I(t) and Q(t) and twice or more the variable step unit of a delay time of the FDF.

Instead of the use of the FDF 705, the sample rate may be multiplied by n through selective interpolation using an up-sample filter, so that the time difference is down-sampled by being extracted at arbitrary timing for every n samples.

In addition, the DPM 72' and DPM 73' are used to perform writing and reading a synchronously; however, they do not have to be of a dual port type when writing and reading will not be performed simultaneously.

Fourth Embodiment

Figure 16:
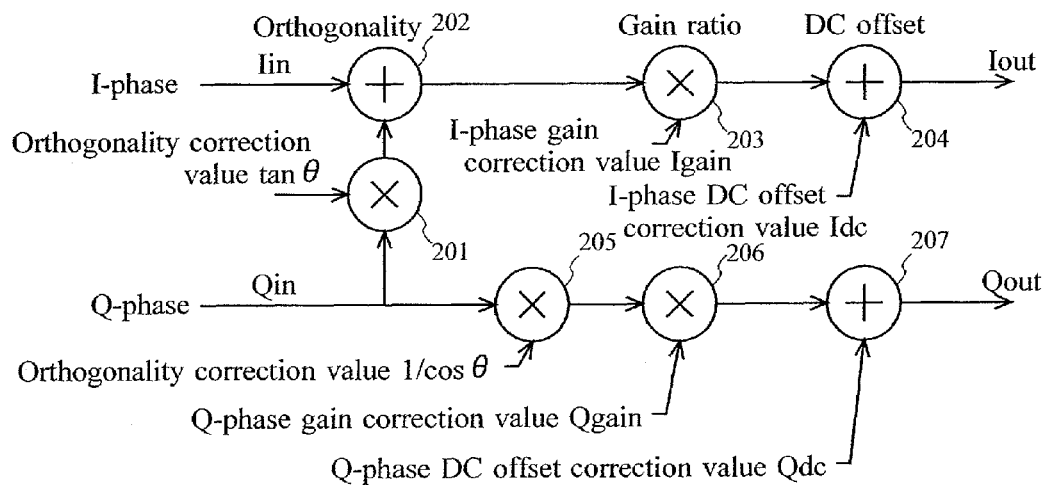
FIG. 16 is a view showing the configuration of a correction circuit of a fourth embodiment.

FIG. 16 shows an example of the configuration of a correction circuit outfitted with a compensator of a fourth embodiment.

The correction circuit of this embodiment performs computation processing specified below on an input signal Iin of the I-phase and an input signal Qin of the Q-phase, and obtains an output signal Iout of the I-phase and an output signal Qout of the Q-phase.

For the I-phase, an input signal Qin of the Q-phase is multiplied by an orthogonality correction value tan $\theta$ in a multiplier 201. An input signal Iin of the I-phase is added to the multiplication result, (Qin×tan $\theta$), from the multiplier 201 in an adder 202. The addition result, {Iin+Qin×tan $\theta$}, from the adder 202 is multiplied by an I-phase gain correction value Igain in a multiplier 203. The multiplication result, Igain{Iin+Qin×tan θ}, from the multiplier 203 is added to an I-phase DC offset correction value Idc in an adder 204. The addition result in the adder 204 is the output signal Iout of the I-phase.

An input signal Qin of the Q-phase is multiplied by an orthogonality correction value (1/cos θ) in a multiplier 205. The multiplication result, {(1/cos θ)×Qin}, from the multiplier 205 is multiplied by the Q-phase gain correction value Qgain in a multiplier 206. The multiplication result, {Qgain×(1/cos θ)×Qin}, from the multiplier 206 is added to a Q-phase DC offset correction value Qdc in an adder 207. The addition result in the adder 207 is the output signal Qout of the Q-phase.

As has been described, equations as follows are established:

$$Iout = Igain\{Iin + Qin \times \tan \theta\} + Idc$$

$$Qout = Qgain \times (1/\cos \theta) \times Qin + Qdc$$

In this embodiment, examples of the configuration and the method for detecting the value or a correction value of a DC offset of the I-phase, or the value or a correction value of a DC offset of the Q-phase will be described.

Firstly, a definition of a DC offset in this embodiment will be given.

In this embodiment, a direct current component generated when a digitally processed signal is converted to an analog signal by passing through a digital-to-analog converter, and a leakage (carrier leak) of a reference frequency signal generated when a digitally processed signal is subjected to quadrature modulation by passing through an analog quadrature modulator are collectively referred to as a DC offset.

In the correction circuit shown in FIG. 16, it is possible to cancel out a DC offset generated with respect to an input signal by varying an I-phase DC offset correction value Idc and a Q-phase DC offset correction value Qdc to be set at adequate values.

In order to achieve such cancellation, this embodiment uses the capability of measuring the magnitude per se of the DC offset when the transmission signal level of a desired wave, such as a modulated wave, is set to 0. To be more specific, it is possible to detect a correction value that can cancel out the DC offset completely by stopping transmission of a desired wave, that is, by setting the transmission level of the desired wave to 0, and then providing the I-phase DC offset correction value Idc and the Q-phase DC offset correction value Qdc to the circuit while varying these values.

Figure 18:
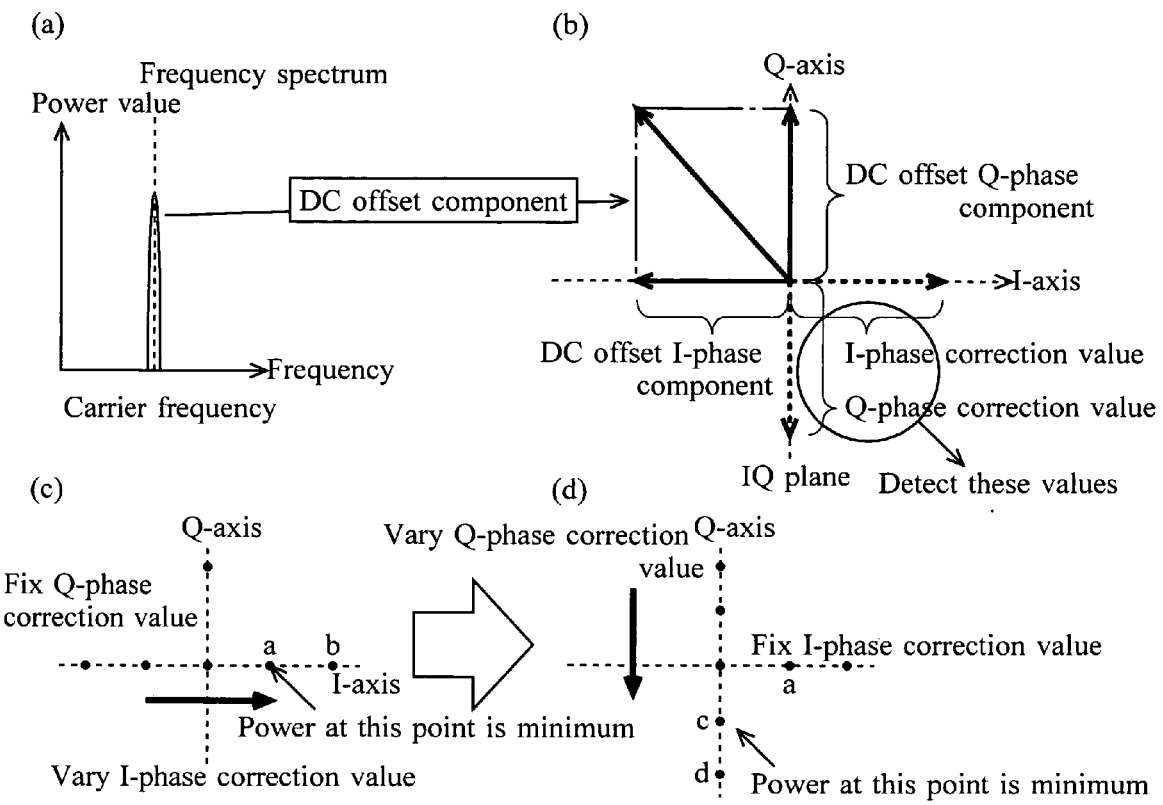
FIGS. 18A through 18D are views used to describe a detecting method of a DC offset.

A DC offset component as shown in FIG. 18A can be regarded separately as an I-phase component and a Q-phase component when viewed in the IQ plane as is shown in FIG. 18B. It is thus possible to remove the DC offset by providing an anti-phase component of the DC offset for each of the I-phase component and the Q-phase component as correction values. There is only one correction value that can cancel out the DC offset for each of the I-phase and the Q-phase, and therefore, only one pair is present.

For example, a correct value of such a correction value may be found by a method as follows. That is, as is shown in FIG. 18C, an I-phase correction value at which the feedback reception power value becomes minimum is found by varying the I-phase correction value while fixing the Q-phase correction value. Then, as is shown in FIG. 18D, a combination with which the feedback reception power value becomes minimum is found by varying the Q-phase correction value while fixing the I-phase correction value to the correct value. However, because searches through the I-phase and the Q-phase are conducted in separate steps to find the correction value of the I-phase and the correction value of the Q-phase individually, this method has a problem that it takes too long.

This embodiment, therefore, shows examples of the configuration and the method for detecting the I-phase DC offset correction value Idc and the Q-phase DC offset correcting value Qdc efficiently in a short time.

An example of an algorithm to conduct such detection will now be described with reference to FIGS. 17A and 17B.

According to the algorithm of this embodiment, the correction value of the I-phase and the correction value of the Q-phase are varied simultaneously to search for correct correction values.

Figure 17:
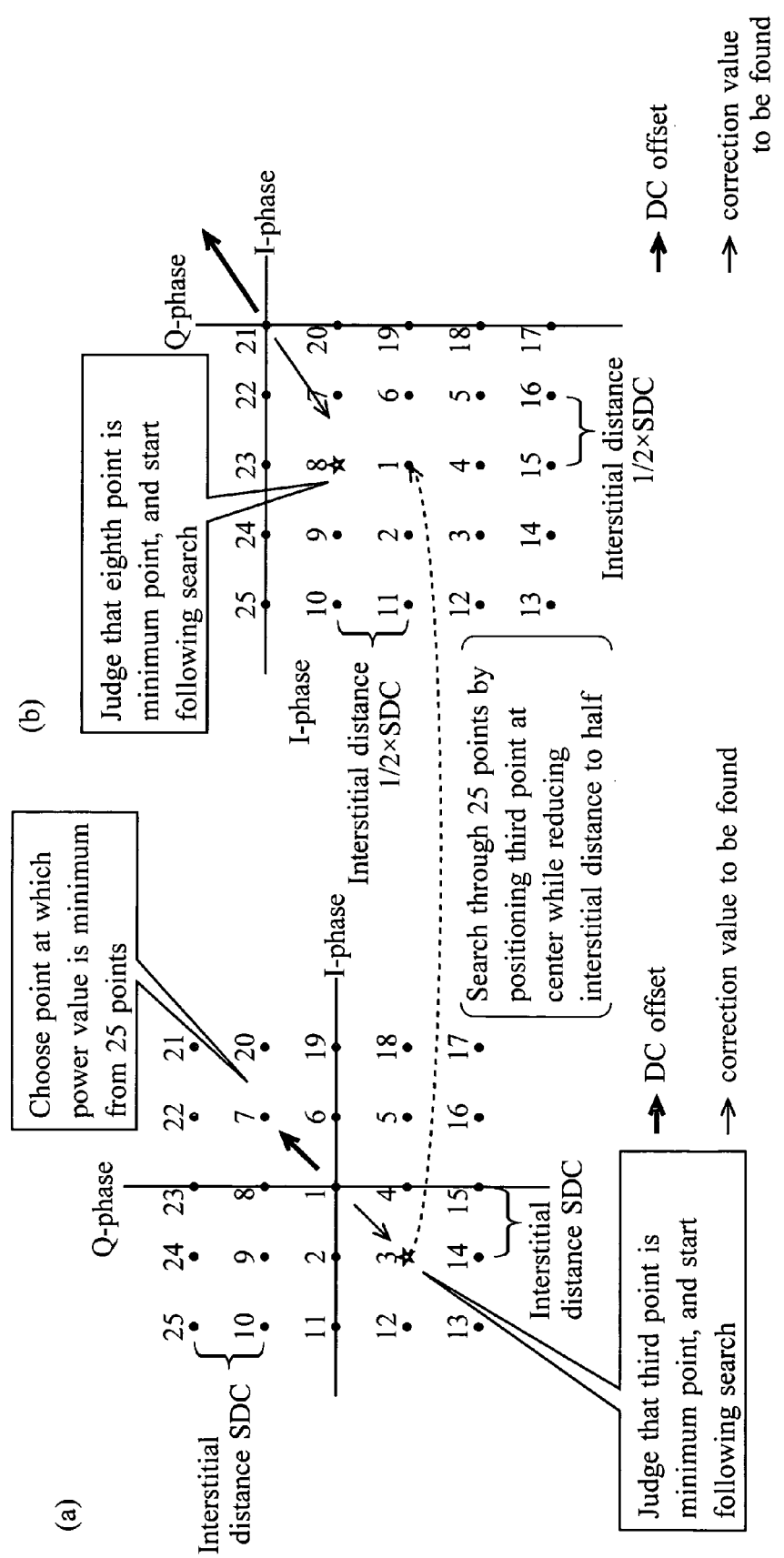
FIGS. 17A and 17B are views used to describe processing according to a DC offset search algorithm of the fourth embodiment.

To be more specific, as is shown in FIG. 17A, 25 points are provided on the IQ plane to form a square. A distance between any two points is equal. For example, let SDC be a distance (interstitial distance) between two adjacent points along the I-axis direction as well as a distance (interstitial distance) between two adjacent points along the Q-axis direction. In the case of FIG. 17A, for example, assume that a first point positioned at the original point is the center, then 8 points, that is, the second through ninth points, are provided on the periphery of the first point to form a square having a side length of (2×SDC), and 16 points, that is, tenth through twenty-fifth points, are provided on the periphery of the second through ninth points to form a square having a side length of (4×SDC). The region of the square comprising the outermost lattice is referred to as a temporary search region.

The value of the I-phase component and the value of the Q-phase component of each point are set as the I-phase DC offset correction value Idc and the Q-phase DC offset correction value Qdc sequentially from the first point to the twenty-fifth point, and a set of the I-phase DC offset correction value Idc and the Q-phase DC offset correction value Qdc, with which power of the feedback signal, that is, a corrected DC offset, becomes minimum is searched for.

When a point at which a corrected DC offset becomes minimum is detected from the 25 points, this point is chosen and following processing is performed. In the case of FIG. 17A, the third point is chosen.

As is shown in FIG. 17B, in the following processing, 25 points are provided to form a square in the same manner as in the last time by positioning the point chosen in the last time at the center while making a distance (interstitial distance) between two adjacent points along the I-axis direction and a distance (interstitial distance) between two adjacent points along the Q-axis direction smaller than in the last time. In the case of FIG. 17B, 25 points, that is, the first through twenty-fifth points, are provided at half the interstitial distance in the last time (that is, ½×SDC) by positioning the third point shown in FIG. 17A at the center. The interstitial distance can be reduced at any ratio with respect to the one in the last time, and for example, it may be increased by a factor of ¼. However, it is normal to set a square having a side length of twice the interstitial distance in the last time as a new search region.

Then, in the same manner as in the last time, a point at which a corrected DC offset becomes minimum when the I-phase component and the Q-phase component are set as the I-phase DC offset correction value Idc and the Q-phase DC offset correction value Qdc, is searched for and chosen from the 25 points.

By performing such processing procedure repetitively, a range of the shift of the I-phase DC offset correction value Idc and the Q-phase DC offset correction value Qdc is narrowed gradually, and the I-phase component and the Q-phase component of a point chosen at an appropriate time are adopted as optimum I-phase DC offset correction value Idc and Q-phase DC offset correction value Qdc. For example, it is possible to adopt a point at which the feedback power value becomes minimum when a distance between points (interstitial distance) ultimately reaches 1 as an optimum correction value.

One example of the procedure of the processing performed according to the algorithm for detecting the DC offset correction value of this embodiment will now be described. In this embodiment, a case where the interstitial distance is increased by a factor of ¼ will be described.

(1) Firstly, 25 points forming a search lattice are provided in a square area having the center at the original point on the IQ plane. Herein, let SDC be an interstitial distance.

(2) Given (I, Q)=(0, 0) as the DC offset correction values of the I-phase and the Q-phase, that is, by setting the correction values to the first point (original point) shown in FIG. 17A, a signal at a transmission level of 0 is transmitted, and a power value of the feedback signal in this instance is measured.

(3) Then, given (I, Q)=(−SCD, 0) as the DC offset correction values of the I-phase and the Q-phase, that is, by setting the correction values to the second point shown in FIG. 17A, a signal at a transmission level of 0 is transmitted, and a power value of the feedback signal in this instance is measured.

(4) Then, given (I, Q)=(−SDC, −SDC) as the DC offset correction values of the I-phase and the Q-phase, that is, by setting the correction values to the third point shown in FIG. 17A, a signal at a transmission level of 0 is transmitted, and a power value of the feedback signal in this instance is measured.

(5) A power value of the feedback signal at each point is measured by varying the correction value in ascending order as described above, and a point at which the power value is minimum, that is, a point at which a corrected DC offset has the minimum value, is found as the minimum point from the 25 points. In the case of FIG. 17A, the third point is found as the minimum point.

(6) Subsequently, 25 points having the minimum point thus found at the center are considered. Herein, the interstitial distance is reduced to ¼ (that is, ¼×SDC) of the interstitial distance of the 25 points searched through in the last time.

(7) A minimum point is searched through the 25 points in this time from the minimum point in the last time.

The case of FIG. 17A continues as follows. That is, given (I, Q)=(−SDC, −SDC), which is the third point in the last time, as the search start point, then a signal at a transmission level of 0 is transmitted, and a power value of the feedback signal in this instance is measured. Then, given (I, Q)=(−SDC−¼×SDC, −SDC) as the DC offset correction value, a signal at a transmission level of 0 is transmitted, and a power value of the feedback signal in this instance is measured. Thereafter, the search is conducted for all the 25 points in the manner as described above.

(8) The processing to reduce the interstitial distance to ¼ by finding a point at which the power value of the feedback signal becomes minimum from 25 points as described above, is repeated until, for example, the interstitial distance reaches 1, and a point at which the power value of the feedback signal become minimum when the interstitial distance is 1 is adopted as the optimum point.

As has been described, the compensator of this embodiment compensates for a DC offset on the input complex amplitude signals in the following manner.

That is, the DC offset correction portion provides an I-phase correction value and a Q-phase correction value for a DC offset of the I-phase component and the Q-phase component of each input complex amplitude signal.

The level detection portion feeds back the complex amplitude signal, to which the correction values are provided from the DC offset correction portion, and detects a level of the feedback signal.

The correction value control portion controls the I-phase correction value and the Q-phase correction value provided from the DC offset correction portion, on the basis of the level detected by the level detection portion.

In this case, the correction value control portion searches through plural points provided initially on the IQ plane at regular intervals for a point (minimum point) at which the level detected by the level detection portion becomes minimum when the level of the input complex amplitude signal is 0 in a case where the I-phase component value and the Q-phase component value of each point are set in the DC offset correction portion as the I-phase correction value and the Q-phase correction value. Thereafter, the correction value control portion conducts the search once or more by using the point searched in the last time as the central point while reducing the regular intervals smaller than in the last time. In short, similar search is conducted twice or more including the initial search. The correction value control portion adopts the I-phase component value and the Q-phase component value at the point found finally as the I-phase correction value and the Q-phase correction value, and sets them in the DC offset correction portion.

It is thus possible to efficiently compensate for a DC offset generated on a complex amplitude signal to be processed.

In this embodiment, the DC offset correction portion is formed from the function of the adder 204 that adds up the I-phase DC offset correction values (I-phase correction values), and the function of the adder 207 that adds up the Q-phase offset correction values (Q-phase correction values) both provided in the correction circuit shown in FIG. 16. The level detection portion is formed from the function of feeding back a signal, that is a complex amplitude signal outputted from the correction circuit and having undergone the digital-to-analog conversion or the analog quadrature modulation, and detecting a level of the feedback signal. The correction value control portion is formed from the function of the control portion (not shown) that controls the I-phase DC offset correction value and the Q-phase DC offset correction value set in the correction circuit to reduce the level detected by the technique described with reference to FIGS. 17A and 17B.

As one example, the radio transmitter shown in FIG. 3 may be configured in such a manner that the correction circuit (including the DC offset correction portion) as shown in FIG. 16 is provided to the distortion correction portion 21, and the level detection portion and the correction value control portion are provided to the control portion 70.

In this embodiment, a complex amplitude signal to be transmitted is used as the input complex amplitude signal. Also, in this embodiment, the distortion correction portion 21 first provides the I-phase correction value and the Q-phase correction value of the DC offset to the complex amplitude signal that will be inputted and processed. Then, the I-phase component value and the Q-phase component value of the DC offset are generated through the digital-to-analog conversion in the digital-to-analog converter 22 and analog quadrature modulation in the analog quadrature modulator 3. The DC offset contained in an output signal is reduced as the I-phase component value and the Q-phase component value are canceled out as a whole. The level detection portion feeds back the signal in which the DC offset is reduced in this manner and detects the level of the feedback signal. When the level of the input complex amplitude signal is 0 in this case, the level detected in this instance corresponds to the level of the remaining DC offset. In this embodiment, the control portion 70 detects this level and controls the level to be smaller.

The level detected by the level detection portion may be, for example, a level of power of an output signal from the digital quadrature detector 61, that is, a sum of squares of the I-phase and the Q-phase, or another level.

Also, when the minimum point is searched for by the correction value control portion, the initial regular intervals can vary to have various distances. A ratio to reduce the regular intervals for each search can also vary. Any number of points can be used as the points to be searched through. For example, the numbers of the points may be the same in all the searches or the numbers of the points may be different, for example, they may be reduced for each search. In addition, the plural points to be searched through can be placed in various manners.

The number of times to repeat the search for the minimum point can vary, too. For example, the search may be repeated exactly the predetermined number of times, or it may be repeated until the regular intervals reach the pre-set value. Alternatively, the search may be repeated until the level detected by the level detection portion is reduced to the pre-set threshold value or below.

In the mode where the level of the complex amplitude signal is 0, it is preferable that the level is completely 0. However, the complex amplitude signal may be at a small level instead of complete 0 as long as it is effective for a practical use.

As has been described, according to the configuration and the method of the compensator of this embodiment, it is possible to search for the values or satisfactory correction values of the DC offset of the I-phase and the Q-phase efficiently in a short time.

The configuration and the method of this embodiment are applicable to various devices, apparatus, and systems, such as a radio transmitter and a distortion compensation quadrature modulator.

The configuration and the method of this embodiment can be combined, for example, with the configurations and the methods described in the other embodiments above.

What is claimed is:

1. An apparatus comprising:
    an affine transformation portion that subjects complex amplitude signals to affine transformation according to affine transformation coefficients and outputs compensated signals;
    a quadrature modulation portion that carries out quadrature modulation according to the compensated signals and outputs a modulated signal;
    a quadrature detection portion that removes a carrier component from one of the modulated signal and a signal based on the modulated signal, and outputs complex feedback signals; and
    a control portion that updates the affine transformation coefficients based on linear distortions remaining in the complex feedback signals;
        wherein: the apparatus serves as a distortion compensation quadrature modulator;
    the affine transformation portion subjects input complex amplitude signals I(t) and Q(t) to the affine transformation according to affine transformation coefficients, and outputs compensated signals a(t) and b(t);
    the quadrature modulation portion comprises a quadrature modulator, and applies quadrature modulation on a local oscillation signal according to the input compensated signals to output the modulated signal as a real signal;
    the quadrature detection portion removes the carrier component from one of the input modulated signal and a signal that is the modulated signal having undergone at least one of frequency conversion and amplification, and outputs complex feedback signals I'(t) and Q'(t);
    the control portion extracts linear distortions remaining in the complex feedback signals I'(t) and Q'(t) as distortion coefficients, and updates the current affine transformation coefficients to new affine transformation coefficients in accordance with updating equations including the distortion coefficients, so that updated affine transformation coefficients are set again in the affine transformation portion;
    as a function of compensating for a DC offset on each input complex amplitude signal, the affine transformation portion includes a DC offset correction portion, and the control portion includes a level detection portion and a correction value control portion;
    the DC offset correction portion provides an I-phase correction value and a Q-phase correction value of the DC offset, respectively, to an I-phase component and a Q-phase component of each input complex amplitude signal;
    the level detection portion feeds back each complex amplitude signal to which the correction values are provided from the DC offset correction portion, and detects a level of a feedback signal;
    the correction value control portion controls the I-phase correction value and the Q-phase correction value provided from the DC offset correction portion according to the level detected by the level detection portion; and
    the correction value control portion searches through plural points provided initially on an IQ plane at regular intervals for a point at which the level detected by the level detection portion is minimum when a level of the input complex amplitude signal is 0 in a case where the I-phase component value and the Q-phase component value of each point are set in the DC offset correction portion as the I-phase correction value and the Q-phase correction value, and thereafter, conducts the search once or more using the point searched in a last time as a central point while making the regular intervals smaller than in the last time, so that the I-phase component value and the Q-phase component value of a point searched finally are adopted as the I-phase correction value and the Q-phase correction value and set in the DC offset correction portion.

2. The apparatus according to claim 1, wherein:
the regular intervals are increased by a factor of ½ for every search.

3. An apparatus comprising:
an affine transformation portion that subjects complex amplitude signals to affine transformation according to affine transformation coefficients and outputs compensated signals;
a quadrature modulation portion that carries out quadrature modulation according to the compensated signals and outputs a modulated signal:
a quadrature detection portion that removes a carrier component from one of the modulated signal and a signal based on the modulated signal, and outputs complex feedback signals; and
a control portion that updates the affine transformation coefficients based on linear distortions remaining in the complex feedback signals, wherein;
the apparatus serves as a distortion compensation quadrature modulator;

the apparatus further comprises a test signal generation portion that generates complex test signals each having plural points on an IQ plane as signal points;

the affine transformation portion subjects the input complex test signals to affine transformation according to given affine transformation coefficients, and outputs compensated signals a(t) and b(t);

the quadrature modulation portion comprises a quadrature modulator and applies quadrature modulation on a local oscillation signal according to the input compensated signals to output the modulated signal as a real signal;

the quadrature detection portion removes a carrier component from one of the input modulated signal and the real signal based on the modulated signal, and outputs the complex feedback signals;

the control portion includes a linear distortion detection portion;

the linear distortion detection portion extracts linear distortions remaining in the complex feedback signals as four distortion coefficients corresponding, respectively, to an I-phase component of a DC offset, a Q-phase component of the DC offset, an IQ gain ratio, and a deviation in orthogonality; and the linear distortion detection portion performs processing as follows, processing by which, for two points of each test signal that are symmetric with respect to an original point on the IQ plane, a distance from a mid point between two points of a corresponding complex feedback signal to the original point on the IQ plane is found, and the I-phase component and the Q-phase component of the DC offset are determined at least on the basis of the distance from the mid point to the original point, processing by which, for four points of the test signals forming sets of two points placed to be symmetric with respect to the original point at a 90° interval on the IQ plane, a distance between two points of a corresponding complex feedback signal in each set on the IQ plane is found, and the IQ gain ratio is determined on the basis of distances between the two points in respective sets, and processing by which, for four points of the test signals forming sets of two points placed to be symmetric with respect to the original point at a 90° interval on the IQ plane, a value corresponding to a shift of an angle, at which lines linking two points of the corresponding complex feedback signals in respective sets on the IQ plane cross each other, from a right angle is found to determine the deviation in the orthogonality.

4. An apparatus comprising:

an affine transformation portion that subjects complex amplitude signals to affine transformation according to affine transformation coefficients and outputs compensated signals;

a quadrature modulation portion that carries out quadrature modulation according to the compensated signals and outputs a modulated signal;

a quadrature detection portion that removes a carrier component from one of the modulated signal and a signal based on the modulated signal, and outputs complex feedback signals; and a control portion that updates the affine transformation coefficients based on linear distortions remaining in the complex feedback signals, wherein;

the apparatus serves as a radio transmitter that performs transmission of plural communication channels;

the apparatus further comprises a digital modulation circuit that synthesizes signals by applying digital modulation at frequencies corresponding to respective carriers according to complex baseband signals of input N carriers (N is an integer equal to or greater than 1), and outputs complex IF signals I(t) and Q(t);

the affine transformation portion comprises an affine transformation circuit, and subjects the input complex amplitude signals I(t) and Q(t) to affine transformation expressed by:

$$a(t)=I(t)+Q(t)\cdot\tan\theta+a$$

$$b(t)=Q(t)/(\alpha\cos\theta)+b$$

where $a$, $b$, $\tan\theta$, and $1/(\alpha\cos\theta)$ are affine transformation coefficients, and outputs compensated signals a(t) and b(t) in which a DC offset, an IQ gain ratio, and a deviation in orthogonality are compensated for;

the apparatus further comprises a digital-to-analog converter that converts the input compensated signals a(t) and b(t) in digital forms to analog forms and outputs resulting signals;

the quadrature modulation portion comprises a quadrature modulator, and applies quadrature modulation on a carrier signal according to outputs inputted from the digital-to-analog converter, and outputs an RF signal;

the apparatus further comprises a power amplifier that amplifies power of the input RF signal, and outputs a resulting signal;

the quadrature detection portion comprises a quadrature wave detection circuit, and subjects a signal based on an output inputted from the power amplifier to digital quadrature wave detection, and outputs complex feedback signals I'(t) and Q'(t) at an IF frequency substantially equal to a frequency in the digital modulation circuit;

the control portion includes a phase rotation removing circuit, a linear distortion detection portion, and a coefficient updating portion;

the phase rotation removing circuit performs complex conjugate multiplication of each input complex IF signal and each complex feedback signal, detects an argument as a phase difference $\theta$ between the complex IF signal and the complex feedback signal, and outputs rotation removed signals $I_r(t)$ and $Q_r(t)$ by removing the phase rotation $\theta$ from each complex feedback signal;

the linear distortion detection portion extracts linear distortions remaining in the complex feedback signals I'(t) and Q'(t) as four distortion coefficients a', b', $\alpha$, and $\sin\theta$ corresponding, respectively, to an I-phase component and a Q-phase component of a DC offset, an IQ gain ratio, and a deviation in orthogonality;

the coefficient updating portion updates the current affine transformation coefficients to new affine transformation coefficients in accordance with updating equations including the distortion coefficients, so that updated affine transformation coefficients are set again in the affine transformation portion;

in a case where the linear distortions are detected while the radio transmitter is under non-operating conditions, the linear distortion detection portion performs processing as follows, processing by which, for two signal points of a test signal comprising a rectangular wave on one of the I-phase and the Q-phase that are symmetric with respect to an original point, a mid point of a corresponding complex feedback signal on an IQ plane is found, the mid point is detected by setting a DC offset whose phase is varied in the affine transformation portion on the assumption that a distance between the mid point and the original point represents magnitude of the DC offset, and the I-phase component and the Q-phase component of the DC offset are determined from the magnitude and the phase of the DC offset at which the distance between the mid point and the original point is minimum, processing by which, for sets of two signal points of test signals each comprising a time-divided rectangular wave on an I-phase and a time-divided rectangular wave on a Q-phase that are symmetric with respect to the original point, a distance between two points of a corresponding complex feedback signal in each set on the IQ plane is found, and the IQ gain ratio is determined on the basis of distances between the two points in respective sets, and processing by which, for sets of two signal points of test signals each comprising a rectangular wave on the I-phase and a rectangular wave on the Q-phase, each wave being time-divided and having different amplitude, that are symmetric with respect to the original point, a value corresponding to a shift of an angle, at which lines linking two points of corresponding complex feedback signals in respective sets on the IQ plane cross each other, from a right angle is found to determine the deviation in orthogonality; and in a case where the linear distortions are detected while the radio transmitter is under operating conditions, the linear distortion detection portion calculates the four distortion coefficients in accordance with equations as follows:

$a' = <I_r(t)>$ $b' = <Q_r(t)>$ $\alpha' = (<I_r(t)^2>/<Q_r(t)^2>)^{1/2}$ $\sin \theta' = -<I_r(t)Q_r(t)>/\{<I_r(t)^2><Q_r(t)^2>\}^{1/2}$ where <> means a long-term average value, and the coefficient updating portion uses equations as follows as the updating equations:

$a_n = a_{n-1} - \mu a'$ $b_n = b_{n-1} - \mu b'$ $\alpha_n = \alpha_{n-1} \times (\alpha')^{1/m}$ $\sin \theta = \sin \theta_{n-1} + \mu \sin \theta'$ $\cos \theta_n = (1 - \sin^2 \theta_n)^{1/2}$ $\tan \theta_n = \sin \theta_n / \cos \theta_n$.

5. The apparatus according to claim 4, wherein:
the control portion includes a delay lock loop that controls a delay between each complex IF signal and each complex feedback signal; and
the delay lock loop comprises,
an FDF that delays the complex IF signal,
a first delay that delays an output from the FDF by one sample time,
a second delay that delays the complex feedback signal by two sample times,
a third delay that delays the complex feedback signal by one sample time,
a fourth delay that delays the complex feedback signal by two sample times,
a fifth delay that delays the complex feedback signal by one sample time,
a first multiplier that performs complex multiplication of an output from the first delay and an output from the second delay,
a second multiplier that performs complex multiplication of the output from the first delay and the complex feedback signal,
a third multiplier that performs complex multiplication of the output from the first delay and an output from the third delay,
a fourth multiplier that performs complex multiplication of an output from the fifth delay and an output from the fourth delay,
a fifth multiplier that performs complex multiplication of the output from the fifth delay and the complex feedback signal,
a sixth multiplier that raises the output from the fifth delay to a second power through complex multiplication,
a first averaging portion that averages outputs from the first multiplier and outputs a result as a correlated value of a late path,
a second averaging portion that averages outputs from the second multiplier and outputs a result as a correlated value of an early path,
a third averaging portion that averages outputs from the third multiplier and outputs a result as a correlated value of a normal path,
a first normalizing portion that normalizes magnitudes of respective correlated values outputted from the first and second averaging portions according to magnitude of the correlated value of the normal path outputted from the third averaging portion,
a first power portion that calculates a sum of squares of an I-phase and a Q-phase of the correlated value of the late path normalized in the first normalizing portion,
a second power portion that calculates a sum of squares of an I-phase and a Q-phase of the correlated value of the early path normalized in the first normalizing portion,
a first adder that subtracts an output from the second power portion from an output from the first power portion,
a fourth averaging portion that averages outputs from the fourth multiplier and outputs a result as a correlated value of the late path,
a fifth averaging portion that averages outputs from the fifth multiplier and outputs a result as a correlated value of the early path,
a sixth averaging portion that averages outputs from the sixth multiplier and outputs a result as a correlated value of the normal path,
a second normalizing portion that normalizes magnitudes of respective correlated values outputted from the fourth and fifth averaging portions on the basis of magnitude of the correlated value of the normal path outputted from the sixth averaging portion,
a third power portion that calculates a sum of squares of an I-phase and a Q-phase of the correlated value of the late path normalized in the second normalizing portion, and outputs a result,
a fourth power portion that calculates a sum of squares of an I-phase and a Q-phase of the correlated value of the early path normalized in the second normalizing portion, and outputs a result,
a second adder that subtracts an output from the fourth power portion from an output from the third power portion, and outputs a result,
a third adder that subtracts an output from the second adder from an output from the first adder, and outputs a result, a seventh averaging portion that averages outputs from the third adder and outputs a result, a control portion that performs control in such a manner that when a symbol of an output from the seventh averaging portion is plus, a delay set in the FDF is reduced, and when the symbol is minus, a delay set in the FDF is increased, and a tap coefficient storage portion that sets tap coefficients in the FDF according to an instruction from the control portion.

6. The apparatus according to claim 5, wherein:

the delay lock loop controls a delay between the complex IF signal and the complex feedback signal so that the complex IF signal and the complex feedback signal are brought into coincidence at time accuracy less than a reciprocal number of a sample rate of the complex IF signal; and the delay lock loop provides, as a delay time difference to be provided to the late path and the early path, a time equal to or less than twice a bandwidth of the complex IF signal and equal to or more than twice a variable step unit of the delay time in the FDF.

7. The apparatus according to claim 4, wherein:

the long-term average is a time average corresponding to a length of 4096 chips or more.

8. The apparatus according to claim 5, wherein:

the long-term average is a time average corresponding to a length of 4096 chips or more.

9. The apparatus according to claim 6, wherein:

the long-term average is a time average corresponding to a length of 4096 chips or more.

* * * * *